(12) United States Patent
Liu et al.

(10) Patent No.: US 10,861,849 B2
(45) Date of Patent: Dec. 8, 2020

(54) TRIMMABLE RESISTOR CIRCUIT AND METHOD FOR OPERATING THE TRIMMABLE RESISTOR CIRCUIT

(71) Applicant: TAIWAN SEMICONDUCTOR MANUFACTURING CO., LTD., Hsinchu (TW)

(72) Inventors: Szu-Lin Liu, Hsinchu (TW); Jaw-Juinn Horng, Hsinchu (TW)

(73) Assignee: TAIWAN SEMICONDUCTOR MANUFACTURING CO., LTD., Hsinchu (TW)

(*) Notice: Subject to any disclaimer, the term of this patent is extended or adjusted under 35 U.S.C. 154(b) by 3 days.

(21) Appl. No.: 16/168,986

(22) Filed: Oct. 24, 2018

(65) Prior Publication Data

US 2020/0058648 A1   Feb. 20, 2020

Related U.S. Application Data

(60) Provisional application No. 62/718,941, filed on Aug. 14, 2018.

(51) Int. Cl.
| | |
|---|---|
| *H01L 27/07* | (2006.01) |
| *H01C 13/02* | (2006.01) |
| *H01L 27/088* | (2006.01) |
| *H01L 27/10* | (2006.01) |
| *H01L 27/02* | (2006.01) |
| *H01L 27/06* | (2006.01) |
| *H01L 27/08* | (2006.01) |
| *H01L 49/02* | (2006.01) |

(52) U.S. Cl.
CPC ......... *H01L 27/0738* (2013.01); *H01C 13/02* (2013.01); *H01L 28/20* (2013.01)

(58) Field of Classification Search
CPC .......................... H01L 27/0629; H01L 27/10
See application file for complete search history.

(56) References Cited

U.S. PATENT DOCUMENTS

| | | | |
|---|---|---|---|
| 2011/0186932 A1* | 8/2011 | Mizumura | H01L 21/823431 257/368 |
| 2017/0030948 A1* | 2/2017 | Baldwin | H01L 27/088 |
| 2018/0182341 A1* | 6/2018 | Imajo | G09G 3/20 |
| 2019/0006352 A1* | 1/2019 | Kobayashi | H01L 27/0629 |

\* cited by examiner

*Primary Examiner* — Omar F Mojaddedi
(74) *Attorney, Agent, or Firm* — McClure, Qualey & Rodack, LLP

(57) ABSTRACT

A trimmable resistor circuit and a method for operating the trimmable resistor circuit are provided. The trimmable resistor circuit includes first sources/drains and first gate structures alternatively arranged in a first row, second sources/drains and second gate structures alternatively arranged in a second row, third sources/drains and third gate structures alternatively arranged in a third row, first resistors disposed between the first row and the second row, and second resistors disposed between the second row and the third row. In the method for operating the trimmable resistor circuit, the first gate structures in the first row and the third gate structures in the third row are turned on. Then, the second gate structures in the second row are turned on/off according to a predetermined resistance value.

18 Claims, 16 Drawing Sheets first resistor circuit equivalent circuit second resistor circuit equivalent circuit

TRIMMABLE RESISTOR CIRCUIT AND METHOD FOR OPERATING THE TRIMMABLE RESISTOR CIRCUIT

RELATED APPLICATION

This application claims the benefit of the Provisional Application Ser. No. 62/718,941, filed Aug. 14, 2018. The entire disclosures of all the above applications are hereby incorporated by reference herein.

BACKGROUND

The semiconductor integrated circuit (IC) industry has experienced rapid growth. In the course of the IC evolution, functional density (defined as the number of interconnected devices per chip area) has generally increased while geometry size (i.e., the smallest component (or line) that can be created using a fabrication process) has decreased. A scaling down process generally provides benefits by increasing production efficiency and lowering associated costs. But, such scaling down has increased the complexity of processing and manufacturing ICs. For these advances to be realized, similar developments in IC manufacturing are needed.

For example, as the semiconductor IC industry has progressed into nanometer technology process nodes in pursuit of higher device density, higher performance, and lower costs, challenges from both fabrication and design have resulted in the development of three-dimensional (3D) devices such fin-like field effect transistors (FinFETs). Advantages of FinFET devices include reducing the short channel effect and higher current flow. However, conventional FinFET devices and methods of fabricating FinFET devices have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
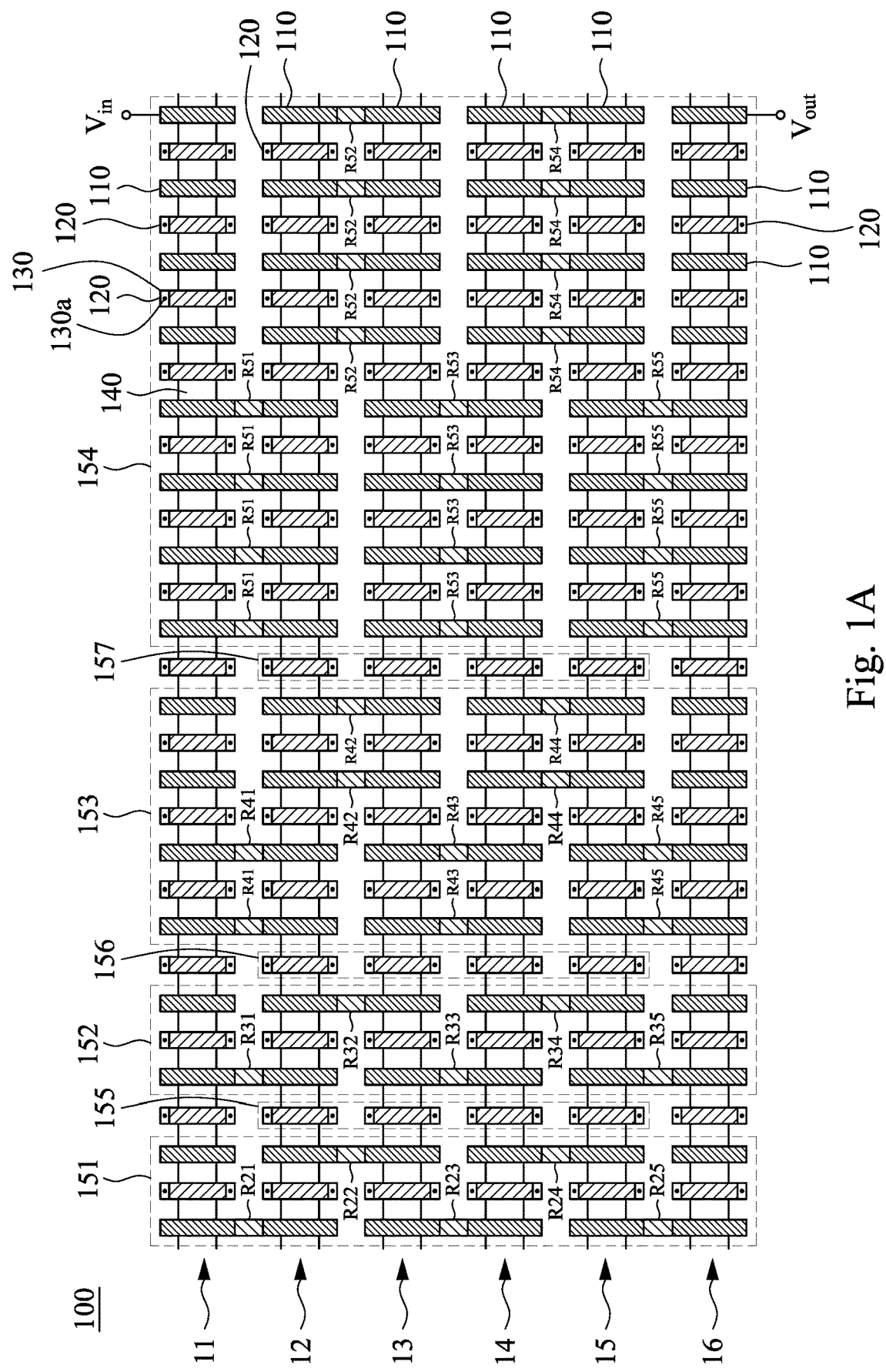
FIG. 1A is a schematic top view showing a trimmable resistor circuit in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact.

Terms used herein are only used to describe the specific embodiments, which are not used to limit the claims appended herewith. For example, unless limited otherwise, the term "one" or "the" of the single form may also represent the plural form. The terms such as "first" and "second" are used for describing various devices, areas and layers, etc., though such terms are only used for distinguishing one device, one area or one layer from another device, another area or another layer. Therefore, the first area can also be referred to as the second area without departing from the spirit of the claimed subject matter, and the others are deduced by analogy. In addition, the present disclosure may repeat reference numerals and/or letters in the various examples. This repetition is for the purpose of simplicity and clarity and does not in itself dictate a relationship between the various embodiments and/or configurations discussed. As used herein, the term "and/or" includes any and all combinations of one or more of the associated listed items.

The FinFET may be patterned by any suitable method. For example, the FinFET may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the FinFET.

Embodiments of the present disclosure are directed to a trimmable resistor circuit and method for operating the trimmable resistor circuit. The trimmable resistor circuit includes first sources/drains, first gate structures, second sources/drains, second gate structures, third sources/drains, third gate structures first resistors and second resistors. The first sources/drains and the first gate structures are alternatively arranged in a first row. The second sources/drains and the second gate structures are alternatively arranged in a second row. The third sources/drains and the third gate structures are alternatively arranged in a third row. The second row is disposed between the first row and the third row. The first resistors are disposed between the first row and the second row, and electrically connected between at least one of the first sources/drains and at least one of the second sources/drains. The second resistors are disposed between the second row and the third row, and electrically connected between at least one of the second sources/drains and at least one of the third sources/drains. In the method for operating the trimmable resistor circuit, a first voltage is applied on the first gate structures in the first row to turn on the first gate structures, such that the first sources/drains in the first row are short-circuited. Then, a second voltage is applied on the third gate structures in the third row to turn on the third gate structures, such that the third sources/drains in the third row are short-circuited. Thereafter, a third voltage is applied on at least one of the second gate structures in the second row in accordance with a predetermined resistance value to enable the trimmable resistor circuit to have the predetermined resistance value.

FIG. 1A is a schematic top view showing a trimmable resistor circuit 100 in accordance with some embodiments of the present disclosure. The trimmable resistor circuit 100 is configured to be operated to provide a predetermined resistance value for a user. In some embodiments, the predetermined resistance value is ranged from about 10 ohm to about 1000 ohm. In some embodiments, a rated current of the trimmable resistor circuit 100 is greater than 1 mA. The trimmable resistor circuit 100 includes resistors R21-R25, R31-R35, R41-R45, R51-R55 and FinFET devices arranged in rows 11, 12, 13, 14, 15 and 16. The resistors R21-R25, R31-R35, R41-R45, and R51-R55 are disposed between the rows 11, 12, 13, 14, 15 and 16. Each of the rows 11, 12, 13, 14, 15 and 16 includes sources/drains 110 and gate structures 120 alternatively arranged on a fin structure 140. In some embodiments, contacts 130 are disposed on the gate structures 120 and vias 130a are formed on the contacts 130. The trimmable resistor circuit 100 receives an input voltage $V_{in}$ through at least one of the sources/drains 110 in the first row 11, and outputs an output voltage $V_{out}$ through at least one of the sources/drains 110 in the sixth row 16. In some embodiments, the trimmable resistor circuit 100 can be divided into a first resistor circuit 151, a second resistor circuit 152, a third resistor circuit 153, a fourth resistor circuit 154, a first isolation circuit 155, a second isolation circuit 156 and a third isolation circuit 157.

The first isolation circuit 155 is disposed between the first resistor circuit 151 and the second resistor circuit 152. The first isolation circuit 155 is configured to isolate the sources/drains 110 of the first resistor circuit 151 in the rows 12, 13, 14 and 15 from the sources/drains 110 of the second resistor circuit 152 in the rows 12, 13, 14 and 15. For example, a voltage can be applied on the gate structures 120 of the first isolation circuit 155 to turn off the gate structures 120. In this case, the gate structures 120 of the first isolation circuit 155 are open, such that the sources/drains 110 of the first resistor circuit 151 in the rows 12, 13, 14 and 15 are electrically isolated from the sources/drains 110 of the second resistor circuit 152 in the rows 12, 13, 14 and 15.

The second isolation circuit 156 is disposed between the second resistor circuit 152 and the third resistor circuit 153. The second isolation circuit 156 is configured to isolate the sources/drains 110 of the second resistor circuit 152 in the rows 12, 13, 14 and 15 from the sources/drains 110 of the third resistor circuit 153 in the rows 12, 13, 14 and 15. For example, a voltage can be applied on the gate structures 120 of the second isolation circuit 156 to turn off the gate structures 120. In this case, the gate structures 120 of the second isolation circuit 156 are open, such that the sources/drains 110 of the second resistor circuit 152 in the rows 12, 13, 14 and 15 are electrically isolated from the sources/drains 110 of the third resistor circuit 153 in the rows 12, 13, 14 and 15.

The third isolation circuit 157 is disposed between the third resistor circuit 153 and the fourth resistor circuit 154. The third isolation circuit 157 is configured to isolate the sources/drains 110 of the third resistor circuit 153 in the rows 12, 13, 14 and 15 from the sources/drains 110 of the fourth resistor circuit 154 in the rows 12, 13, 14 and 15. For example, a voltage can be applied on the gate structures 120 of the third isolation circuit 157 to turn off the gate structures 120. In this case, the gate structures 120 of the third isolation circuit 157 are open, such that the sources/drains 110 of the third resistor circuit 153 in the rows 12, 13, 14 and 15 are electrically isolated from the sources/drains 110 of the fourth resistor circuit 154 in the rows 12, 13, 14 and 15.

In some embodiments, the gate structures 120 in the first row 11 and the sixth row 16 are turned on, thereby enabling the gate structures 120 in the first row 11 and the sixth row 16 to be short-circuited. Therefore, the sources/drains 110 in the first row 11 and the sixth row 16 are short-circuited, such that the first resistor circuit 151, the second resistor circuit 152, the third resistor circuit 153 and the fourth resistor circuit 154 are electrically connected in parallel.

Figure 1B:
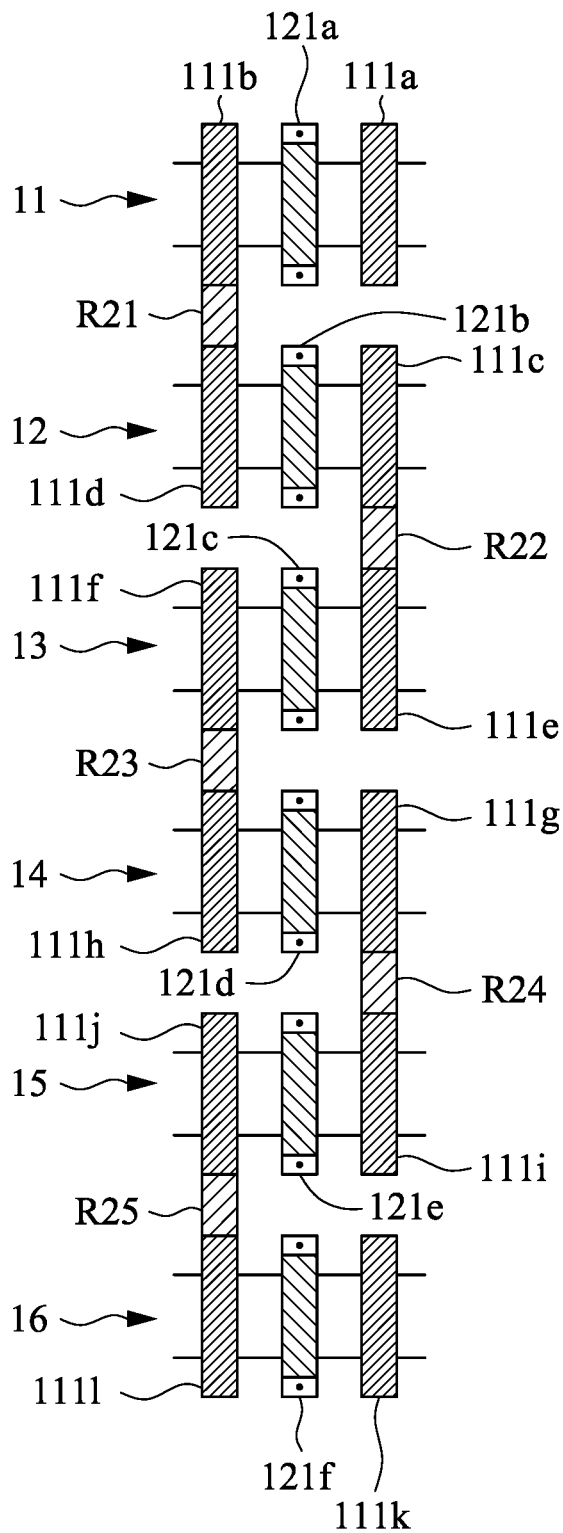
FIG. 1B is a schematic top view showing the first resistor circuit and an equivalent circuit thereof in accordance with some embodiments of the present disclosure.
Figure 1B:
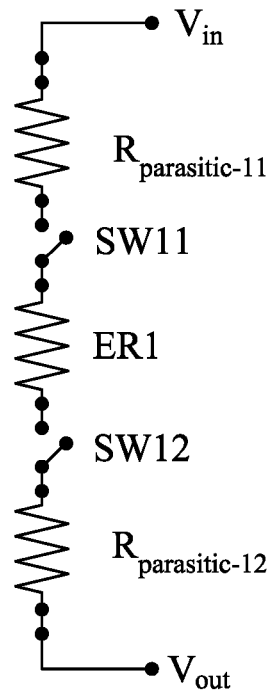

FIG. 1B is a schematic top view showing the first resistor circuit 151 and an equivalent circuit thereof in accordance with some embodiments of the present disclosure. For purposes of convenience, the sources/drains and gate structures of the first resistor circuit 151 are represented with different reference numbers. The first resistor circuit 151 includes sources/drains 111a, 111b, 111c, 111d, 111e, 111f, 111g, 111h, 111i, 111j, 111k, 111l, and gate structures 121a, 121b, 121c, 121d, 121e and 121f. The gate structure 121a and the sources/drains 111a, 111b are arranged in the first row 11, in which the gate structure 121a is disposed between the sources/drains 111a and 111b. The gate structure 121b and the sources/drains 111c, 111d are arranged in the second row 12, in which the gate structure 121b is disposed between the sources/drains 111c and 111d. The gate structure 121c and the sources/drains 111e, 111f are arranged in the third row 13, in which the gate structure 121c is disposed between the sources/drains 111e and 111f. The gate structure 121d and the sources/drains 111g, 111h are arranged in the fourth row 14, in which the gate structure 121d is disposed between the sources/drains 111g and 111f. The gate structure 121e and the sources/drains 111i, 111j are arranged in the fifth row 15, in which the gate structure 121e is disposed between the sources/drains 111i and 111j. The gate structure 121f and the sources/drains 111k, 111l are arranged in the sixth row 16, in which the gate structure 121f is disposed between the sources/drains 111l and 111k.

The resistor R21 is disposed between the first row 11 and second row 12. In some embodiments, the resistor R21 is electrically connected between the sources/drains 111b and 111d. The resistor R22 is disposed between the second row 12 and third row 13. In some embodiments, the resistor R22 is electrically connected between the sources/drains 111c and 111e. The resistor R23 is disposed between the third row 13 and fourth row 14. In some embodiments, the resistor R23 is electrically connected between the sources/drains 111f and 111h. The resistor R24 is disposed between the fourth row 14 and fifth row 15. In some embodiments, the resistor R24 is electrically connected between the sources/drains 111g and 111i. The resistor R25 is disposed between the fifth row 15 and the sixth row 16. In some embodiments, the resistor R25 is electrically connected between the sources/drains 111j and 111l.

When the first resistor circuit 151 is operated, the gate structures 121a and 121f in the first row 11 and the sixth row 16 are always short-circuited to reduce the values of the parasitic resistances $R_{parasitic-11}$ and $R_{parasitic-12}$, and the gate structures 121b, 121c, 121d and 121e are turned on/off in accordance with the predetermined resistance value. Therefore, switches SW11 and SW12 are used to represent the gate structures 121b, 121c, 121d and 121e, and resistance ER1 is used to represent a sum of the values of the resistors R21, R22, R23, R24 and R25.

Figure 1C:
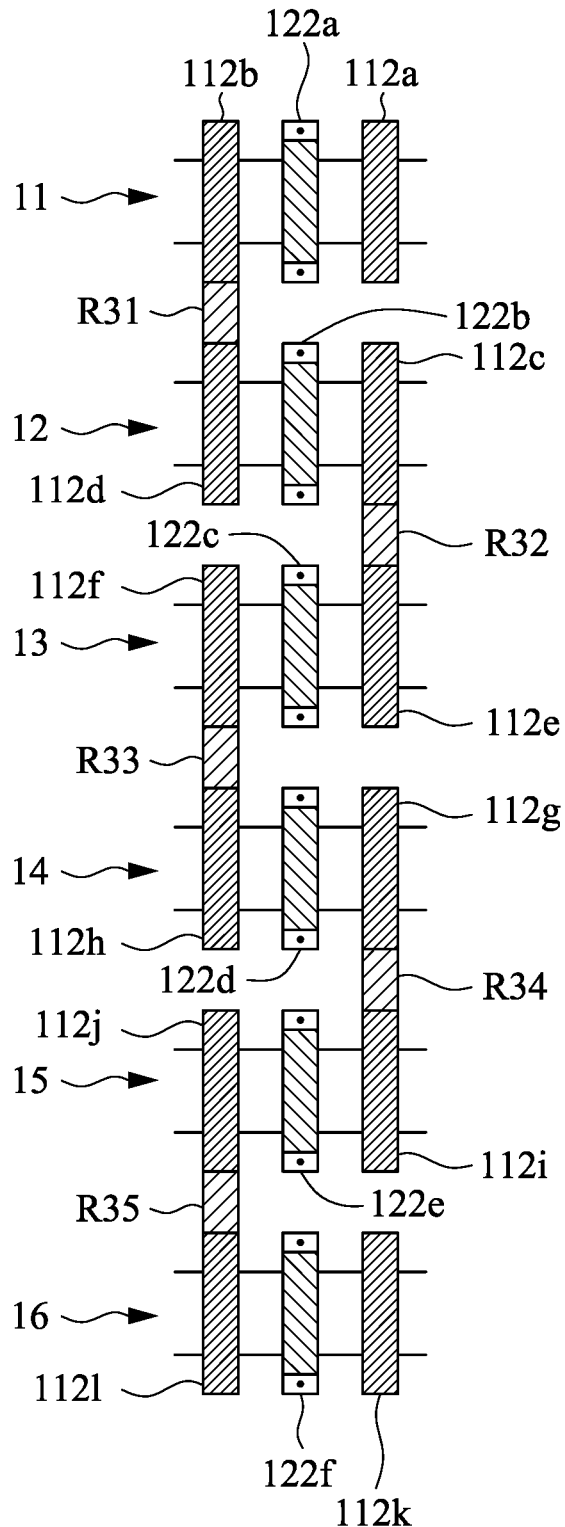
FIG. 1C is a schematic top view showing the second resistor circuit and an equivalent circuit thereof in accordance with some embodiments of the present disclosure.
Figure 1C:
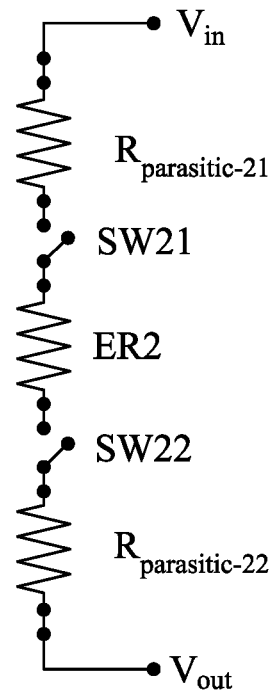

FIG. 1C is a schematic top view showing the second resistor circuit 152 and an equivalent circuit thereof in accordance with some embodiments of the present disclosure. For purposes of convenience, the sources/drains and gate structures of the second resistor circuit 152 are represented with different reference numbers. The second resistor circuit 152 includes sources/drains 112a, 112b, 112c, 112d, 112e, 112f, 112g, 112h, 112i, 112j, 112k, 112l, and gate structures 122a, 122b, 122c, 122d, 122e and 122f. The gate structure 122a and the sources/drains 112a, 112b are arranged in the first row 11, in which the gate structure 122a is disposed between the sources/drains 112a and 112b. The gate structure 122b and the sources/drains 112c, 112d are arranged in the second row 12, in which the gate structure 122b is disposed between the sources/drains 112c and 112d. The gate structure 122c and the sources/drains 112e, 112f are arranged in the third row 13, in which the gate structure 122c is disposed between the sources/drains 112e and 112f. The gate structure 122d and the sources/drains 112g, 112h are arranged in the fourth row 14, in which the gate structure 122d is disposed between the sources/drains 112g and 112f. The gate structure 122e and the sources/drains 112i, 112j are arranged in the fifth row 15, in which the gate structure 122e is disposed between the sources/drains 112i and 112j. The gate structure 122f and the sources/drains 112k, 112l are arranged in the sixth row 16, in which the gate structure 122f is disposed between the sources/drains 112l and 112k.

The resistor R31 is disposed between the first row 11 and second row 12. In some embodiments, the resistor R31 is electrically connected between the sources/drains 112b and 112d. The resistor R32 is disposed between the second row 12 and third row 13. In some embodiments, the resistor R32 is electrically connected between the sources/drains 112c and 112e. The resistor R33 is disposed between the third row 13 and fourth row 14. In some embodiments, the resistor R33 is electrically connected between the sources/drains 112f and 112h. The resistor R34 is disposed between the fourth row 14 and fifth row 15. In some embodiments, the resistor R34 is electrically connected between the sources/drains 112g and 112i. The resistor R35 is disposed between the fifth row 15 and the sixth row 16. In some embodiments, the resistor R35 is electrically connected between the sources/drains 112j and 112l.

When the second resistor circuit 152 is operated, the gate structures 122a and 122f in the first row 11 and the sixth row 16 are always short-circuited to reduce the values of the parasitic resistances $R_{parasitic-21}$ and $R_{parasitic-22}$, and the gate structures 122b, 122c, 122d and 122e are turned on/off in accordance with the predetermined resistance value. Therefore, switches SW21 and SW22 are used to represent the gate structures 122b, 122c, 122d and 122e, and resistance ER2 is used to represent a sum of the values of the resistors R31, R32, R33, R34 and R35.

Figure 1D:
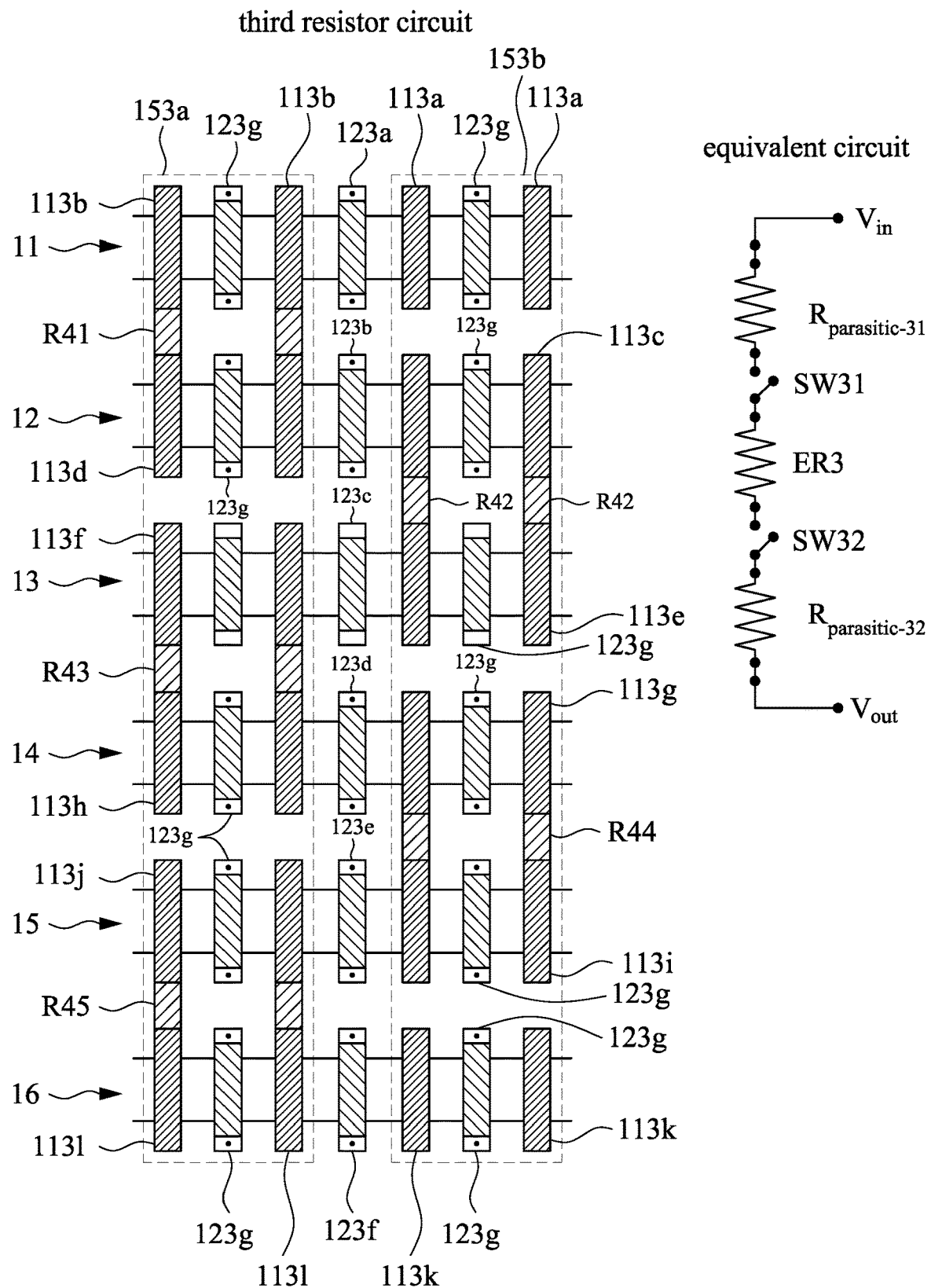
FIG. 1D is a schematic top view showing the third resistor circuit and an equivalent circuit thereof in accordance with some embodiments of the present disclosure.

FIG. 1D is a schematic top view showing the third resistor circuit 153 and an equivalent circuit thereof in accordance with some embodiments of the present disclosure. For purposes of convenience, the sources/drains and gate structures of the third resistor circuit 153 are represented with different reference numbers. The third resistor circuit 153 includes sources/drains 113a, 113b, 113c, 113d, 113e, 113f, 113g, 113h, 113i, 113j, 113k, 113l, and gate structures 123a, 123b, 123c, 123d, 123e, 123f and 123g. The gate structure 123a, the gate structures 123g and the sources/drains 113a, 113b are arranged in the first row 11, in which the gate structure 123a is disposed between the sources/drains 113a and 113b to divide the sources/drains 113a and 113b into a first group including the sources/drains 113a and a second group including the sources/drains 113b. With respect to the first group of sources/drains 113a, the gate structure 123g is disposed between the sources/drains 113a. Similarly, with respect to the second group of sources/drains 113b, the gate structure 123g is disposed between the sources/drains 113b.

The gate structure 123b, the gate structures 123g and the sources/drains 113c, 113d are arranged in the second row 12, in which the gate structure 123b is disposed between the sources/drains 113c and 113d to divide the sources/drains 113c and 113d into a first group including the sources/drains 113c and a second group including the sources/drains 113d. With respect to the first group of sources/drains 113c, the gate structure 123g is disposed between the sources/drains 113c. Similarly, with respect to the second group of sources/drains 113d, the gate structure 123g is disposed between the sources/drains 113d. The gate structure 123c, the gate structures 123g and the sources/drains 113e, 113f are arranged in the third row 13, in which the gate structure 123c is disposed between the sources/drains 113e and 113f to divide the sources/drains 113e and 113f into a first group including the sources/drains 113e and a second group including the sources/drains 113f. With respect to the first group of sources/drains 113e, the gate structure 123g is disposed between the sources/drains 113e. Similarly, with respect to the second group of sources/drains 113f, the gate structure 123g is disposed between the sources/drains 113f.

The gate structure 123d, the gate structures 123g and the sources/drains 113g, 113h are arranged in the fourth row 14, in which the gate structure 123d is disposed between the sources/drains 113g and 113h to divide the sources/drains 113g and 113h into a first group including the sources/drains 113g and a second group including the sources/drains 113h. With respect to the first group of sources/drains 113g, the gate structure 123g is disposed between the sources/drains 113g. Similarly, with respect to the second group of sources/drains 113h, the gate structure 123g is disposed between the sources/drains 113h. The gate structure 123e, the gate structures 123g and the sources/drains 113i, 113j are arranged in the fifth row 15, in which the gate structure 123e is disposed between the sources/drains 113i and 113j to divide the sources/drains 113i and 113j into a first group including the sources/drains 113i and a second group including the sources/drains 113j. With respect to the first group of the sources/drains 113i, the gate structure 123g is disposed between the sources/drains 113i. Similarly, with respect to the second group of sources/drains 113j, the gate structure 123g is disposed between the sources/drains 113j. The gate structure 123f, the gate structures 123g and the sources/drains 113k, 113l are arranged in the sixth row 16, in which the gate structure 123f is disposed between the sources/drains 113k and 113l to divide the sources/drains 113k and 113l into a first group including the sources/drains 113k and a second group including the sources/drains 113l. With respect to the first group of sources/drains 113k, the gate structure 123g is disposed between the sources/drains 113k. Similarly, with respect to the second group of sources/drains 113l, the gate structure 123g is disposed between the sources/drains 113l.

The resistors R41 are disposed between the first row 11 and second row 12. In some embodiments, the resistors R41 are electrically connected in parallel between the sources/drains 113b and 113d. The resistors R42 are disposed between the second row 12 and third row 13. In some embodiments, the resistors R42 are electrically connected in parallel between the sources/drains 113c and 113e. The resistors R43 are disposed between the third row 13 and fourth row 14. In some embodiments, the resistors R43 are electrically connected in parallel between the sources/drains 113f and 113h. The resistors R44 are disposed between the fourth row 14 and fifth row 15. In some embodiments, the resistors R44 are electrically connected in parallel between the sources/drains 113g and 113i. The resistors R45 are disposed between the fifth row 15 and the sixth row 16. In some embodiments, the resistors R45 are electrically connected in parallel between the sources/drains 113j and 113l.

The third resistor circuit 153 can be divided into a left part 153a and a right part 153b. When the third resistor circuit 153 is operated, the gate structures 123g in the left part 153a and the right part 153b are always short-circuited, and the gate structures 123b, 123c, 123d and 123e disposed between the left part 153a and the right part 153b are turned on/off in accordance with the predetermined resistance value. Therefore, switches SW31 and SW32 are used to represent the gate structures 123b, 123c, 123d and 123e, and resistance ER3 is used to represent a sum of the values of the parallel resistors R41, R42, R43, R44 and R45. Further, the gate structures 123a, 123f and 123g in the first row 11 and the sixth row 16 are always short-circuited to reduce the values of the parasitic resistances $R_{parasitic-31}$ and $R_{parasitic-32}$.

Figure 1E:
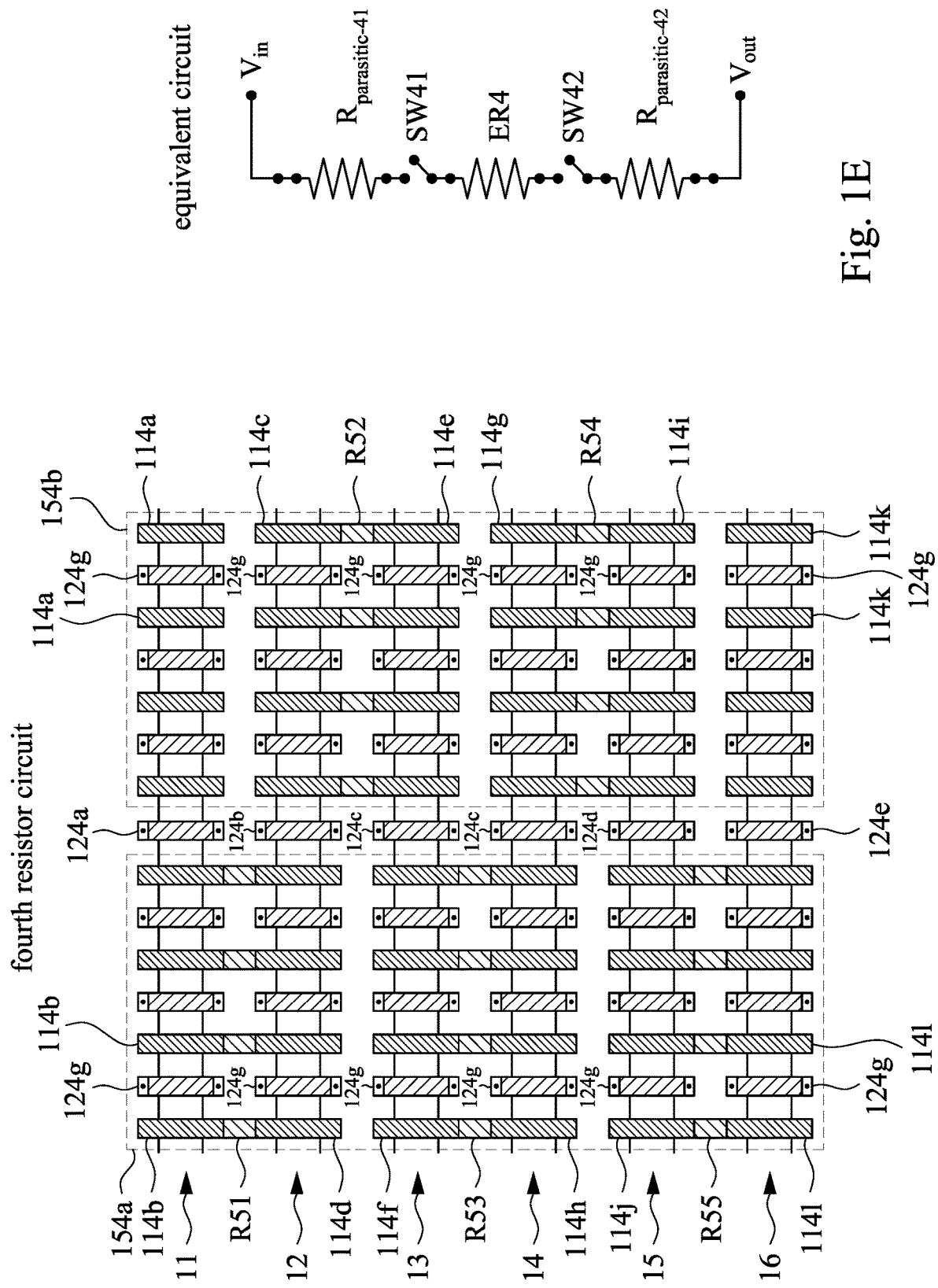
FIG. 1E is a schematic top view showing the fourth resistor circuit and an equivalent circuit thereof in accordance with some embodiments of the present disclosure.

FIG. 1E is a schematic top view showing the fourth resistor circuit 154 and an equivalent circuit thereof in accordance with some embodiments of the present disclosure. For purposes of convenience, the sources/drains and gate structures of the fourth resistor circuit 154 are represented with different reference numbers. The fourth resistor circuit 154 includes sources/drains 114a, 114b, 114c, 114d, 114e, 114f, 114g, 114h, 114i, 114j, 114k, 114l, and gate structures 124a, 124b, 124c, 124d, 124e, 124f and 124g. The gate structure 124a, the gate structures 124g and the sources/drains 114a, 114b are arranged in the first row 11, in which the gate structure 124a is disposed between the sources/drains 114a and 114b to divide the sources/drains 114a and 114b into a first group including the sources/drains 114a and a second group including the sources/drains 114b. With respect to the first group of sources/drains 114a, the gate structures 124g and the sources/drains 114a are alternatively arranged. Similarly, with respect to the second group of sources/drains 114b, the gate structures 124g and the sources/drains 114b are alternatively arranged.

The gate structure 124b, the gate structures 124g and the sources/drains 114c, 114d are arranged in the second row 12, in which the gate structure 124b is disposed between the sources/drains 114c and 114d to divide the sources/drains 114c and 114d into a first group including the sources/drains 114c and a second group including the sources/drains 114d. With respect to the first group of sources/drains 114c, the gate structures 124g and the sources/drains 114c are alternatively arranged. Similarly, with respect to the second group of sources/drains 114d, the gate structures 124g and the sources/drains 114d are alternatively arranged. The gate structure 124c, the gate structures 124g and the sources/drains 114e, 114f are arranged in the third row 13, in which the gate structure 124c is disposed between the sources/drains 114e and 114f to divide the sources/drains 114e and 114f into a first group including the sources/drains 114e and a second group including the sources/drains 114f. With respect to the first group of sources/drains 114e, the gate structures 124g and the sources/drains 114e are alternatively arranged. Similarly, with respect to the second group of sources/drains 114f, the gate structures 124g and the sources/drains 114f are alternatively arranged.

The gate structure 124d, the gate structures 124g and the sources/drains 114g, 114h are arranged in the fourth row 14, in which the gate structure 124d is disposed between the sources/drains 114g and 114h to divide the sources/drains 114g and 114h into a first group including the sources/drains 114g and a second group including the sources/drains 114h. With respect to the first group of sources/drains 114g, the gate structures 124g and the sources/drains 114g are alternatively arranged. Similarly, with respect to the second group of sources/drains 114h, the gate structures 124g and the sources/drains 114h are alternatively arranged. The gate structure 124e, the gate structures 124g and the sources/drains 114i, 114j are arranged in the fifth row 15, in which the gate structure 124e is disposed between the sources/drains 114i and 114j to divide the sources/drains 114i and 114j into a first group including the sources/drains 114i and a second group including the sources/drains 114j. With respect to the first group of sources/drains 114i, the gate structures 124g and the sources/drains 114i are alternatively arranged. Similarly, with respect to the second group of sources/drains 114j, the gate structures 124g and the sources/drains 114j are alternatively arranged. The gate structure 124l, the gate structures 124g and the sources/drains 114k, 114l are arranged in the sixth row 16, in which the gate structure 124f is disposed between the sources/drains 114k and 114l to divide the sources/drains 114k and 114l into a first group including the sources/drains 114k and a second group including the sources/drains 114l. With respect to the first group of sources/drains 114k, the gate structures 124g and the sources/drains 114k are alternatively arranged. Similarly, with respect to the second group of sources/drains 114l, the gate structures 124g and the sources/drains 114l are alternatively arranged.

The resistors R51 are disposed between the first row 11 and second row 12. In some embodiments, the resistors R51 are electrically connected in parallel between the sources/drains 114b and 114d. The resistors R52 are disposed between the second row 12 and third row 13. In some embodiments, the resistors R52 are electrically connected in parallel between the sources/drains 114c and 114e. The resistors R53 are disposed between the third row 13 and fourth row 14. In some embodiments, the resistors R53 are electrically connected in parallel between the sources/drains 114f and 114h. The resistors R54 are disposed between the fourth row 14 and fifth row 15. In some embodiments, the resistors R54 are electrically connected in parallel between the sources/drains 114g and 114i. The resistors R55 are disposed between the fifth row 15 and the sixth row 16. In some embodiments, the resistors R55 are electrically connected in parallel between the sources/drains 114j and 114l.

The fourth resistor circuit 154 can be divided into a left part 154a and a right part 154b. When the fourth resistor circuit 154 is operated, the gate structures 124g in the left part 154a and the right part 154b are always short-circuited, and the gate structures 124b, 124c, 124d and 124e disposed between the left part 154a and the right part 154b are turned on/off in accordance with the predetermined resistance value. Therefore, switches SW41 and SW42 are used to represent the gate structures 124b, 124c, 124d and 124e, and resistance ER4 is used to represent a sum of the values of the parallel resistors R51, R52, R53, R54 and R55. Further, the gate structures 124a, 124f and 124g in the first row 11 and the sixth row 16 are always short-circuited to reduce the values of the parasitic resistances $R_{parasitic-41}$ and $R_{parasitic-42}$. In some embodiments, all the sources/drains 110 in the first row 11 are designed to have vias for electrical connection to the input voltage $V_{in}$, and all the sources/drains 110 in the sixth row 16 are designed to have vias for outputting the output voltage $V_{out}$, thereby further reducing the values of the parasitic resistances $R_{parasitic-41}$ and $R_{parasitic-42}$.

Figure 1F:
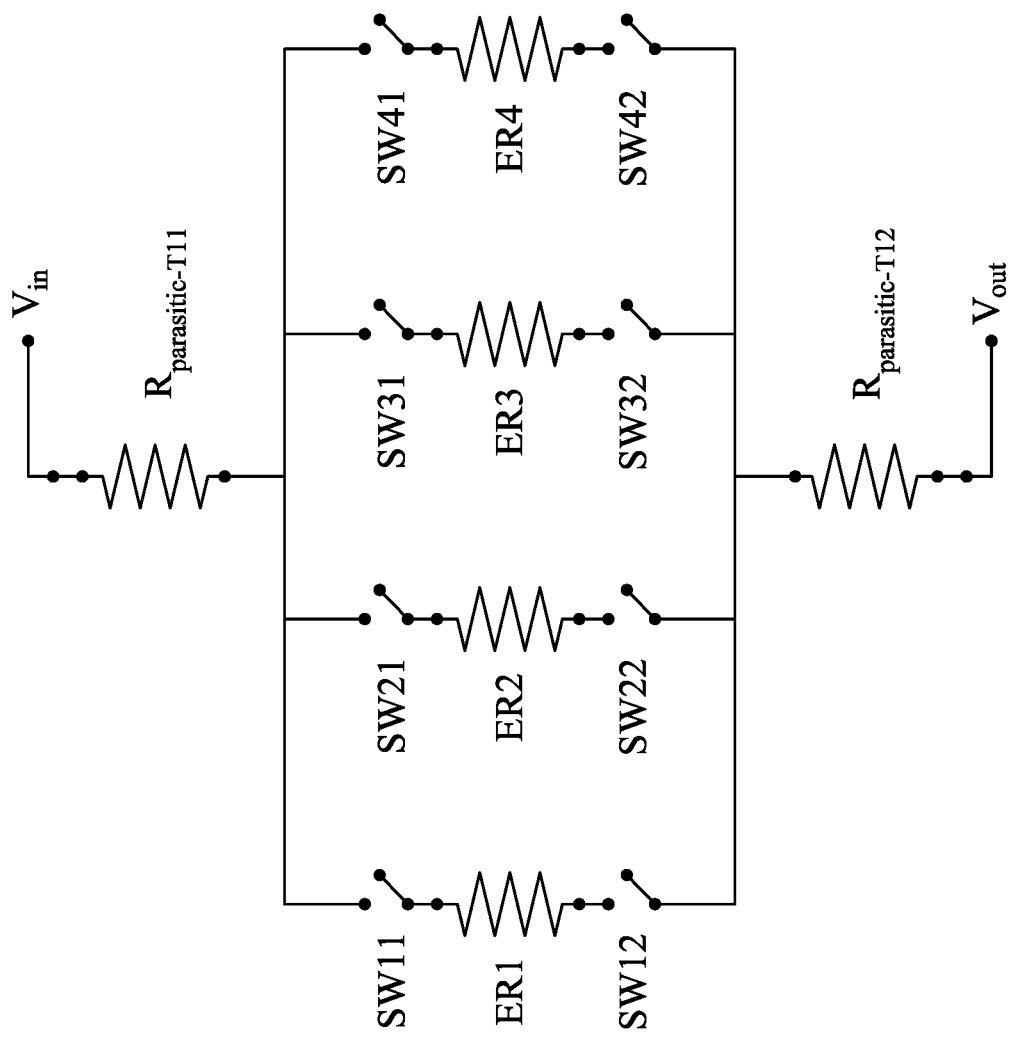
FIG. 1F is a schematic circuit diagram showing an equivalent circuit of the trimmable resistor circuit in accordance with some embodiments of the present disclosure.

FIG. 1F is a schematic circuit diagram showing an equivalent circuit of the trimmable resistor circuit 100 in accordance with some embodiments of the present disclosure. Because the first resistor circuit 151, the second resistor circuit 152, the third resistor circuit 153 and the fourth resistor circuit 154 are electrically connected in parallel, the parasitic resistances $R_{parasitic-11}$, $R_{parasitic-21}$, $R_{parasitic-31}$ and $R_{parasitic-41}$ are electrically connected in parallel and represented by a parasitic resistance $R_{parasitic-T11}$, and the parasitic resistances $R_{parasitic-12}$, $R_{parasitic-22}$, $R_{parasitic-32}$ and $R_{parasitic-42}$ are electrically connected in parallel and represented by a parasitic resistance $R_{parasitic-T12}$. As shown in FIG. 1F, a resistance value of the trimmable resistor circuit 100 is determined by the states of the switches SW11, SW12, SW21, SW22, SW31, SW32, SW41 and SW42. Therefore, the user can switch the switches SW11, SW12, SW21, SW22, SW31, SW32, SW41 and SW42 to enable the trimmable resistor circuit 100 to have the predetermined resistance value desired for the user. In some embodiments, the value of the resistance ER2 is equal to the value of the resistance ER1; the value of the resistance ER3 is twice the value of the resistance ER2; the value of the resistance ER4 is twice the value of the resistance ER3.

Figure 2:
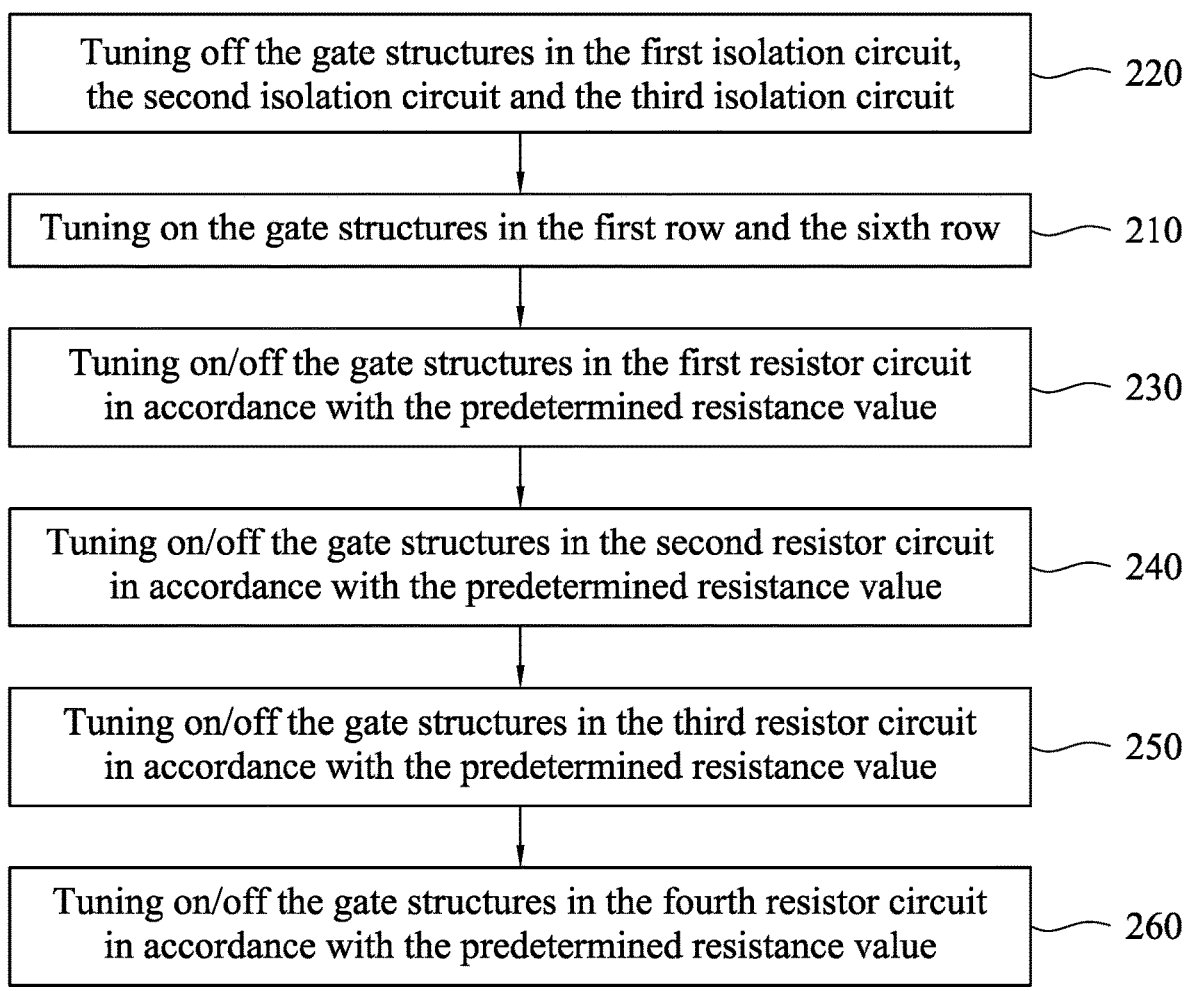
FIG. 2 is a flow chart showing a method 200 for operating the trimmable resistor circuit in accordance with some embodiments of the present disclosure.

FIG. 2 is a flow chart showing a method 200 for operating the trimmable resistor circuit 100 in accordance with some embodiments of the present disclosure. In the method 200, at operation 210, a first voltage is applied on all gate structures 120 of the first isolation circuit 155, the second isolation circuit 156 and the third isolation circuit 157 to isolate the first resistor circuit 151, the second resistor circuit 152, the third resistor circuit 153 and the fourth resistor circuit 154 from each other. Then, at operation 220, a second voltage is applied on all gate structures 120 in the first row 11 and the sixth row 16, such that the first resistor circuit 151, the second resistor circuit 152, the third resistor circuit 153 and the fourth resistor circuit 154 are electrically connected in parallel. Thereafter, at operation 230, the gate structures 121b, 121c, 121d and 121e of the first resistor circuit 151 is turned on/off in accordance with the predetermined resistance value desired for the user. Then, at operation 240, the gate structures 122b, 122c, 122d and 122e of the second resistor circuit 152 is turned on/off in accordance with the predetermined resistance value. Thereafter, at operation 250, the gate structures 123b, 123c, 123d and 123e of the third resistor circuit 153 is turned on/off in accordance with the predetermined resistance value. Then, at operation 260, the gate structures 124b, 124c, 124d and 124e of the fourth resistor circuit 154 is turned on/off in accordance with the predetermined resistance value.

Figure 3A:
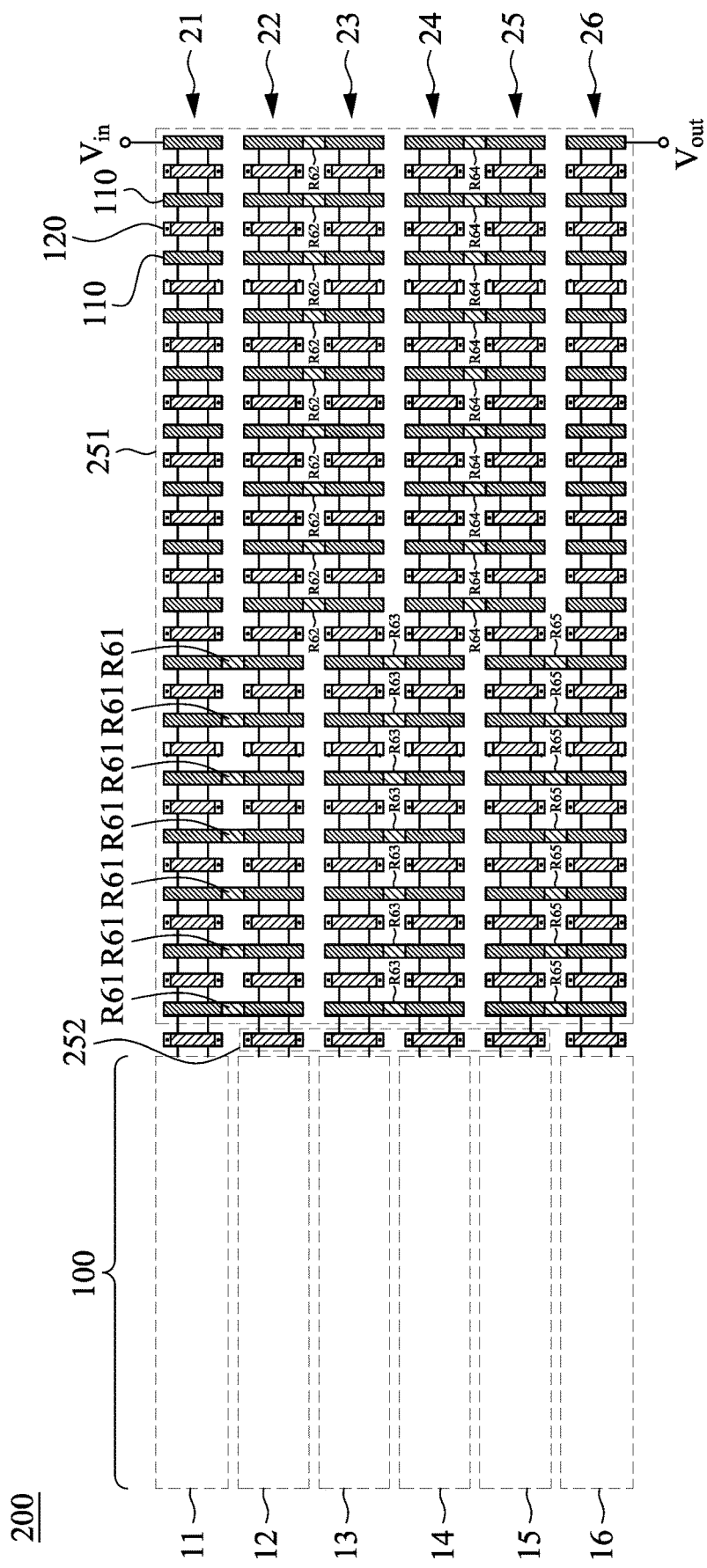
FIG. 3A is a schematic top view showing a trimmable resistor circuit in accordance with some embodiments of the present disclosure.

FIG. 3A is a schematic top view showing a trimmable resistor circuit 200 in accordance with some embodiments of the present disclosure. The trimmable resistor circuit 200 includes the trimmable resistor circuit 100 and additional circuits for expansion. In some embodiments, the trimmable resistor circuit 200 includes the resistors R21-R25, R31-R35, R41-R45, R51-R55, resistors R61-R65 and FinFET devices arranged in rows 21, 22, 23, 24, 25 and 26. The first row 21 includes the row 11 and additional sources/drains 110 and gate structures 120. The second row 22 includes the row 12 and additional sources/drains 110 and gate structures 120. The third row 23 includes the row 13 and additional sources/drains 110 and gate structures 120. The fourth row 24 includes the row 14 and additional sources/drains 110 and gate structures 120. The fifth row 25 includes the row 15 and additional sources/drains 110 and gate structures 120. The sixth row 26 includes the row 16 and additional sources/drains 110 and gate structures 120.

The trimmable resistor circuit 200 can be divided into the trimmable resistor circuit 100, a fifth resistor circuit 251 and a fourth isolation circuit 252 disposed between the trimmable resistor circuit 100 and the fifth resistor circuit 251. The fourth isolation circuit 252 is configured to isolate the sources/drains 110 of the trimmable resistor circuit 100 in the rows 22, 23, 23 and 25 from the sources/drains 110 of the fifth resistor circuit 251 in the rows 22, 23, 24 and 25. For example, a voltage can be applied on the gate structures 120 of the fourth isolation circuit 252 to turn off the gate structures 120. In this case, the gate structures 120 of the fourth isolation circuit 252 are open, such that the sources/drains 110 of the trimmable resistor circuit 100 in the rows 22, 23, 24 and 25 are electrically isolated from the sources/drains 110 of the fifth resistor circuit 251 in the rows 22, 23, 24 and 25.

In some embodiments, the gate structures 120 in the first row 21 and the sixth row 26 are turned on, thereby enabling the gate structures 120 in the first row 21 and the sixth row 26 to be short-circuited. Therefore, the sources/drains 110 in the first row 21 and the sixth row 26 are short-circuited, such that the fifth resistor circuit 251 and the first resistor circuit 151, the second resistor circuit 152, the third resistor circuit 153 and the fourth resistor circuit 154 of the trimmable resistor circuit 100 are electrically connected in parallel.

Figure 3B:
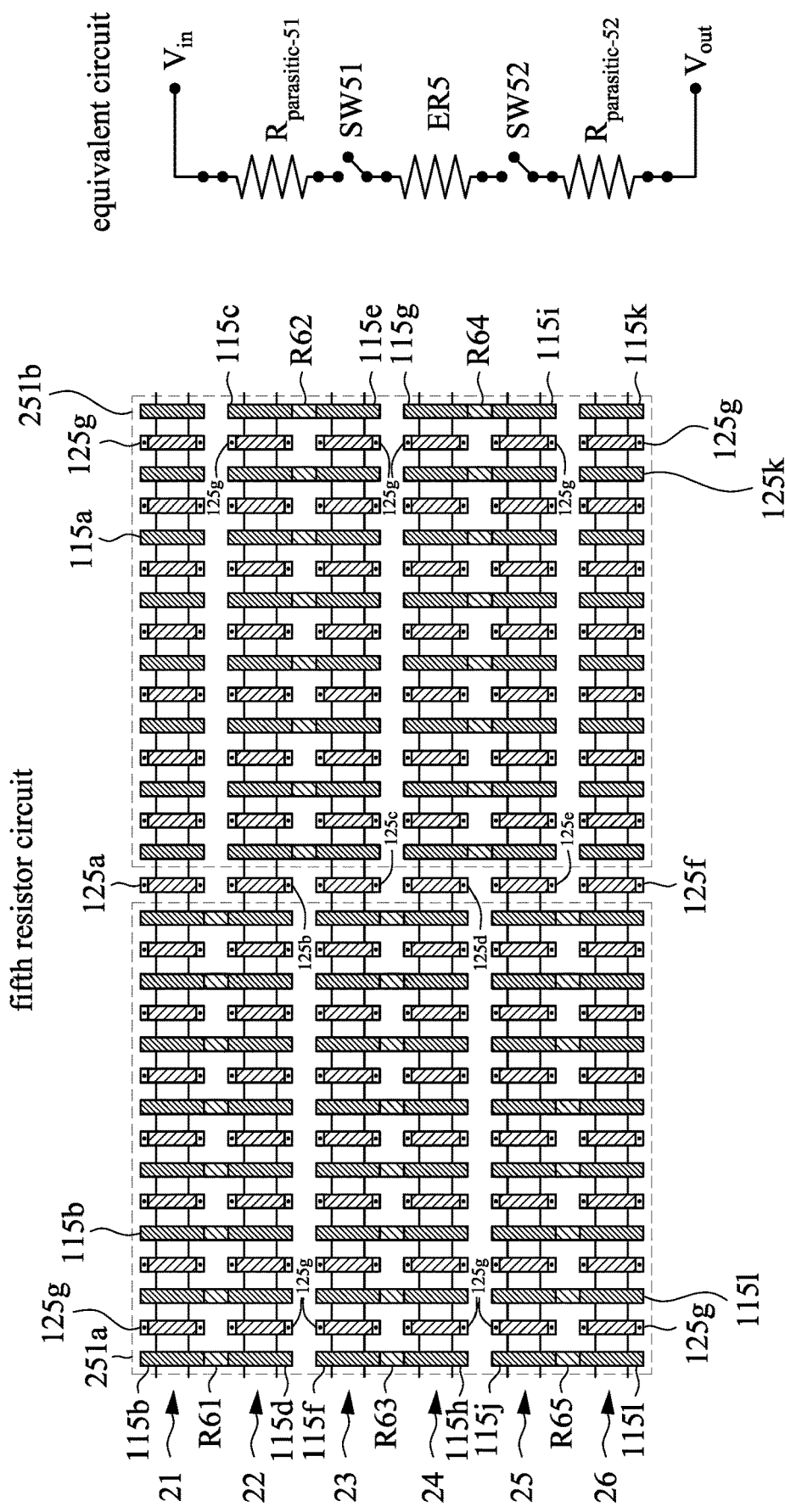
FIG. 3B is a schematic top view showing the fifth resistor circuit and an equivalent circuit thereof in accordance with some embodiments of the present disclosure.

FIG. 3B is a schematic top view showing the fifth resistor circuit 251 and an equivalent circuit thereof in accordance with some embodiments of the present disclosure. For purposes of convenience, the sources/drains and gate structures of the fifth resistor circuit 251 are represented with different reference numbers. The fifth resistor circuit 251 includes sources/drains 115a, 115b, 115c, 115d, 115e, 115f, 115g, 115h, 115i, 115j, 115k, 115l, and gate structures 125a, 125b, 125c, 125d, 125e, 125f and 125g. The gate structure 125a, the gate structures 125g and the sources/drains 115a, 115b are arranged in the first row 21, in which the gate structure 125a is disposed between the sources/drains 115a and 115b to divide the sources/drains 115a and 115b into a first group including the sources/drains 115a and a second group including the sources/drains 115b. With respect to the first group of sources/drains 115a, the gate structures 125g and the sources/drains 115a are alternatively arranged. Similarly, with respect to the second group of sources/drains 115b, the gate structures 125g and the sources/drains 115b are alternatively arranged.

The gate structure 125b, the gate structures 125g and the sources/drains 115c, 115d are arranged in the second row 22, in which the gate structure 125b is disposed between the sources/drains 115c and 115d to divide the sources/drains 115c and 115d into a first group including the sources/drains 115c and a second group including the sources/drains 115d. With respect to the first group of sources/drains 115c, the gate structures 125g and the sources/drains 115c are alternatively arranged. Similarly, with respect to the second group of sources/drains 115d, the gate structures 125g and the sources/drains 115d are alternatively arranged. The gate structure 125c, the gate structures 125g and the sources/drains 115e, 115f are arranged in the third row 23, in which the gate structure 125c is, disposed between the sources/drains 115e and 115f to divide the sources/drains 115e and 115f into a first group including the sources/drains 115e and a second group including the sources/drains 115f. With respect to the first group of sources/drains 115e, the gate structures 125g and the sources/drains 115e are alternatively arranged. Similarly, with respect to the second group of sources/drains 115f, the gate structures 125g and the sources/drains 115f are alternatively arranged.

The gate structure 125d, the gate structures 125g and the sources/drains 115g, 115h are arranged in the fourth row 24, in which the gate structure 125d is disposed between the sources/drains 115g and 115h to divide the sources/drains 115g and 115h into a first group including the sources/drains 115g and a second group including the sources/drains 115h. With respect to the first group of sources/drains 115g, the gate structures 125g and the sources/drains 115g are alternatively arranged. Similarly, with respect to the second group of sources/drains 115h, the gate structures 125g and the sources/drains 115h are alternatively arranged. The gate structure 125e, the gate structures 125g and the sources/drains 115i, 115j are arranged in the fifth row 15, in which the gate structure 125e is disposed between the sources/drains 115i and 115j to divide the sources/drains 115i and 115j into a first group including the sources/drains 115i and a second group including the sources/drains 115j. With respect to the first group of sources/drains 115i, the gate structures 125g and the sources/drains 115i are alternatively arranged. Similarly, with respect to the second group of sources/drains 115j, the gate structures 125g and the sources/drains 115j are alternatively arranged. The gate structure 125f, the gate structures 125g and the sources/drains 115k, 115l are arranged in the sixth row 26, in which the gate structure 125f is disposed between the sources/drains 115k and 115l to divide the sources/drains 115k and 115l into a first group including the sources/drains 115k and a second group including the sources/drains 115l. With respect to the first group of sources/drains 115k, the gate structures 125g and the sources/drains 115k are alternatively arranged. Similarly, with respect to the second group of sources/drains 115l, the gate structures 125g and the sources/drains 115l are alternatively arranged.

The resistors R61 are disposed between the first row 21 and second row 22. In some embodiments, the resistors R61 are electrically connected in parallel between the sources/drains 115b and 115d. The resistors R62 are disposed between the second row 22 and third row 23. In some embodiments, the resistors R62 are electrically connected in parallel between the sources/drains 115c and 115e. The resistors R63 are disposed between the third row 23 and fourth row 24. In some embodiments, the resistors R63 are electrically connected in parallel between the sources/drains 115f and 115h. The resistors R64 are disposed between the fourth row 24 and fifth row 25. In some embodiments, the resistors R64 are electrically connected in parallel between the sources/drains 115g and 115i. The resistors R65 are disposed between the fifth row 25 and the sixth row 26. In some embodiments, the resistors R65 are electrically connected in parallel between the sources/drains 115j and 115l.

The fifth resistor circuit 251 can be divided into a left part 251a and a right part 251b. When the fifth resistor circuit 251 is operated, the gate structures 125g in the left part 251a and the right part 251b are always short-circuited, and the gate structures 125b, 125c, 125d and 125e disposed between the left part 251a and the right part 251b are turned on/off in accordance with the predetermined resistance value. Therefore, switches SW51 and SW52 are used to represent the gate structures 125b, 125c, 125d and 125e, and resistance ER5 is used to represent a sum of the values of the parallel resistors R61, R62, R63, R64 and R65. Further, the gate structures 125a, 125f and 125g in the first row 21 and the sixth row 26 are always short-circuited to reduce the values of the parasitic resistances $R_{parasitic-51}$ and $R_{parasitic-52}$.

Figure 3C:
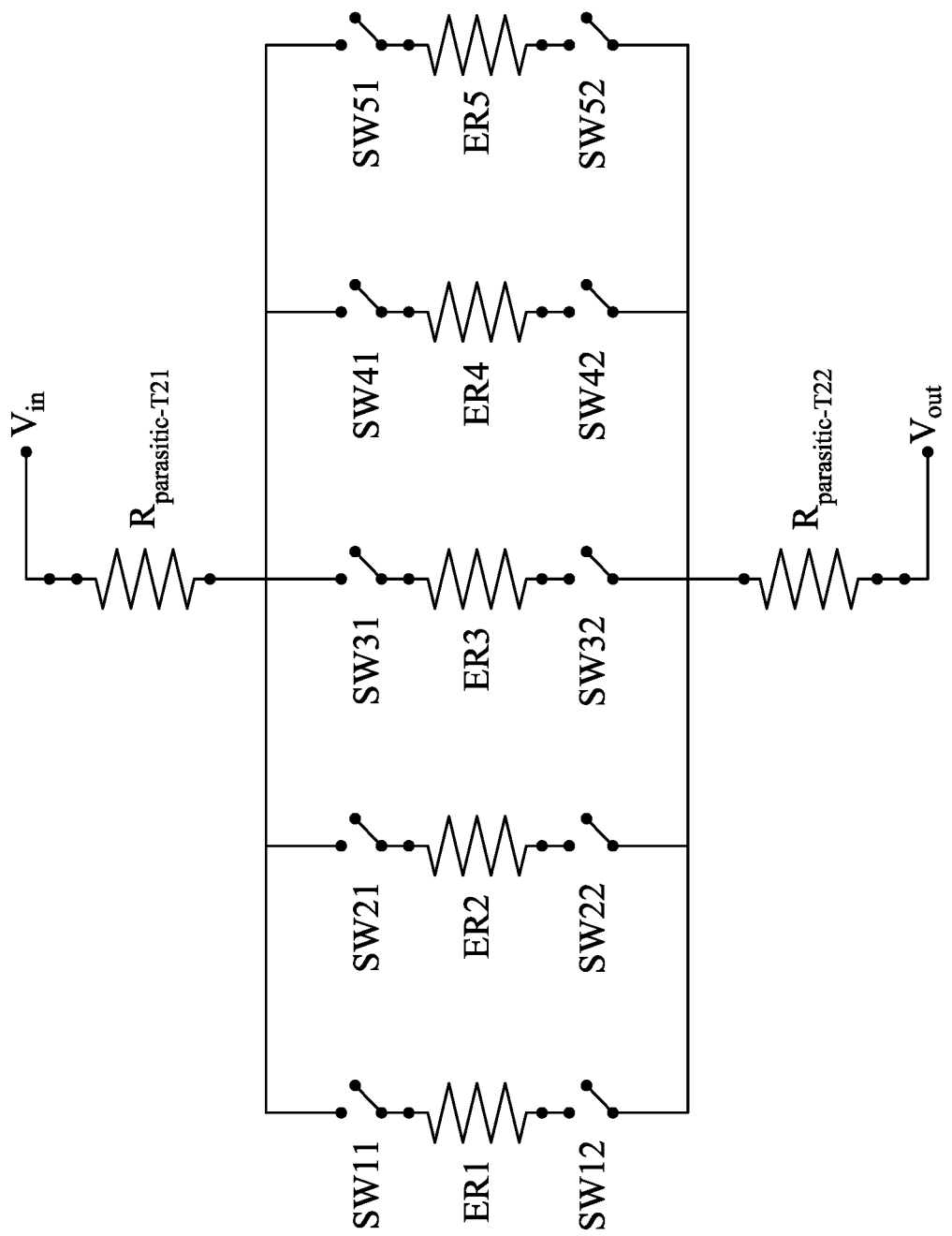
FIG. 3C is a schematic circuit diagram showing an equivalent circuit of the trimmable resistor circuit in accordance with some embodiments of the present disclosure.

FIG. 3C is a schematic circuit diagram showing an equivalent circuit of the trimmable resistor circuit 200 in accordance with some embodiments of the present disclosure. Because the first resistor circuit 151, the second resistor circuit 152, the third resistor circuit 153, the fourth resistor circuit 154 and the fifth resistor circuit 251 are electrically connected in parallel, the parasitic resistances $R_{parasitic-11}$, $R_{parasitic-21}$, $R_{parasitic-31}$, $R_{parasitic-41}$ and $R_{parasitic-51}$ are electrically connected in parallel and represented by a parasitic resistance $R_{parasitic-T21}$, and the parasitic resistances $R_{parasitic-12}$, $R_{parasitic-22}$, $R_{parasitic-32}$, $R_{parasitic-42}$ and $R_{parasitic-52}$ are electrically connected in parallel and represented by a parasitic resistance $R_{parasitic-T22}$. As shown in FIG. 3C, a resistance value of the trimmable resistor circuit 200 is determined by the states of the switches SW11, SW12, SW21, SW22, SW31, SW32, SW41, SW42, SW51 and SW52. Therefore, the user can switch the switches SW11, SW12, SW21, SW22, SW31, SW32, SW41, SW42, SW51 and SW52 to enable the trimmable resistor circuit 200 to have the predetermined resistance value desired for the user.

Figure 4A:
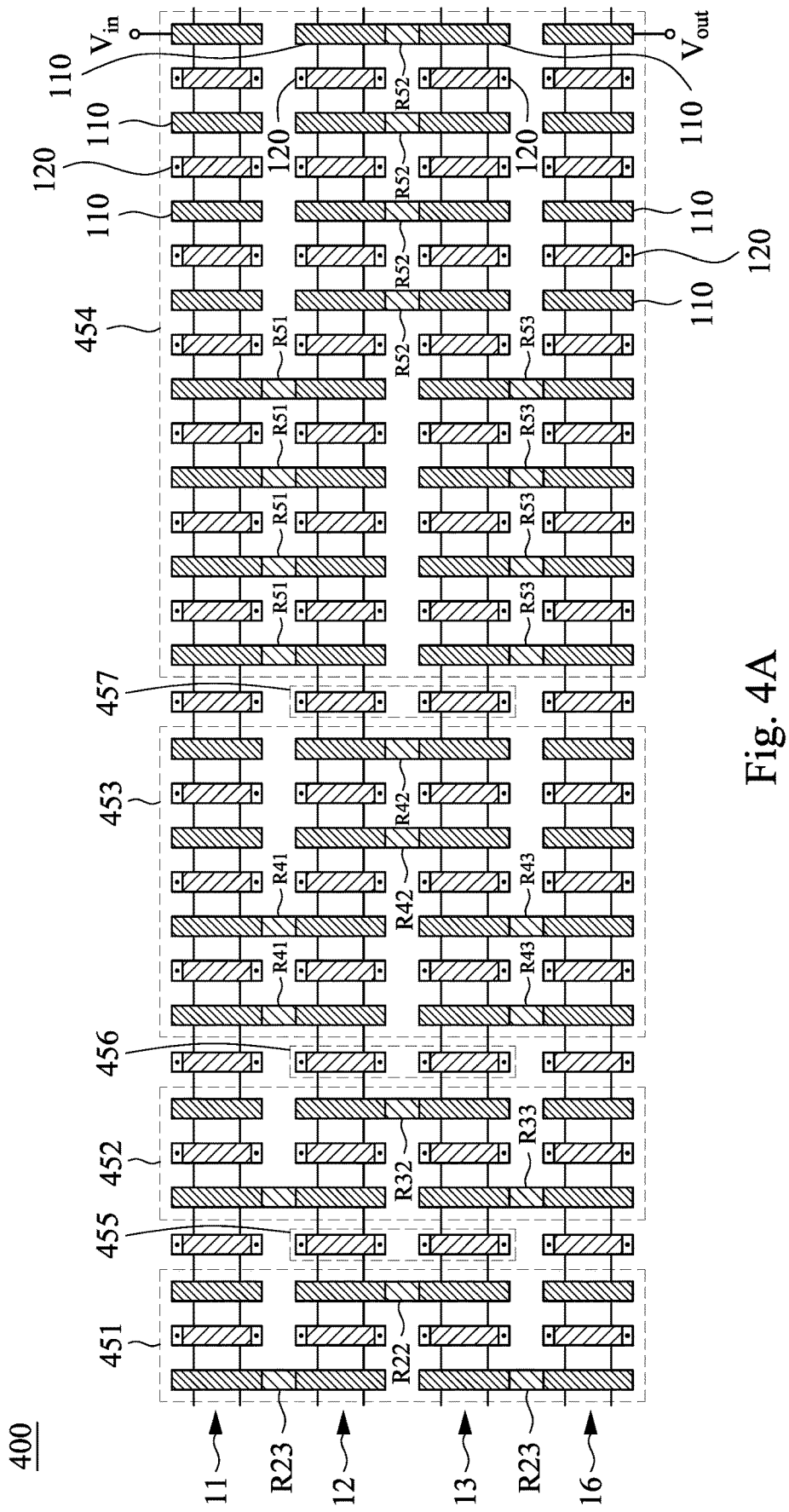
FIG. 4A is a schematic top view showing a trimmable resistor circuit in accordance with some embodiments of the present disclosure.

FIG. 4A is a schematic top view showing a trimmable resistor circuit 400 in accordance with some embodiments of the present disclosure. The trimmable resistor circuit 400 is similar to the trimmable resistor circuit 100, but the difference is in that the fourth row 14, the fifth row 15 and the resistors R24, R25, R34, R35, R44, R45, R54 and R55 are omitted in the trimmable resistor circuit 400. In some embodiments, the trimmable resistor circuit 100 can be divided into a first resistor circuit 451, a second resistor circuit 452, a third resistor circuit 453, a fourth resistor circuit 454, a first isolation circuit 455, a second isolation circuit 456 and a third isolation circuit 457. The first isolation circuit 455 is similar to the first isolation circuit 155 shown in FIG. 1A, but the first isolation circuit 455 does not includes the gate structures 120 in the fourth row 14 and the fifth row 15. The second isolation circuit 456 is similar to the second isolation circuit 156 shown in FIG. 1A, but the second isolation circuit 456 does not includes the gate structures 120 in the fourth row 14 and the fifth row 15. The third isolation circuit 457 is similar to the third isolation circuit 157 shown in FIG. 1A, but the third isolation circuit 457 does not includes the gate structures 120 in the fourth row 14 and the fifth row 15.

Figure 4B:
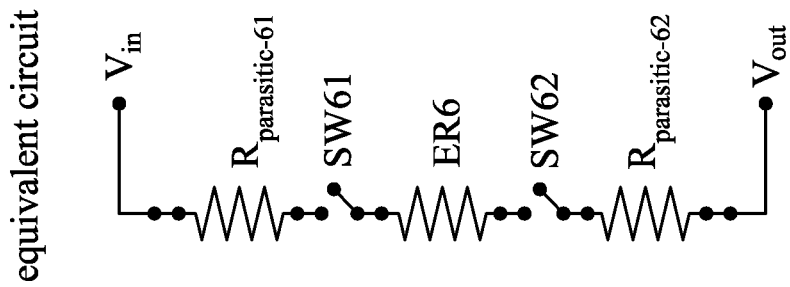
FIG. 4B is a schematic top view showing the first resistor circuit and an equivalent circuit thereof in accordance with some embodiments of the present disclosure.
Figure 4B:
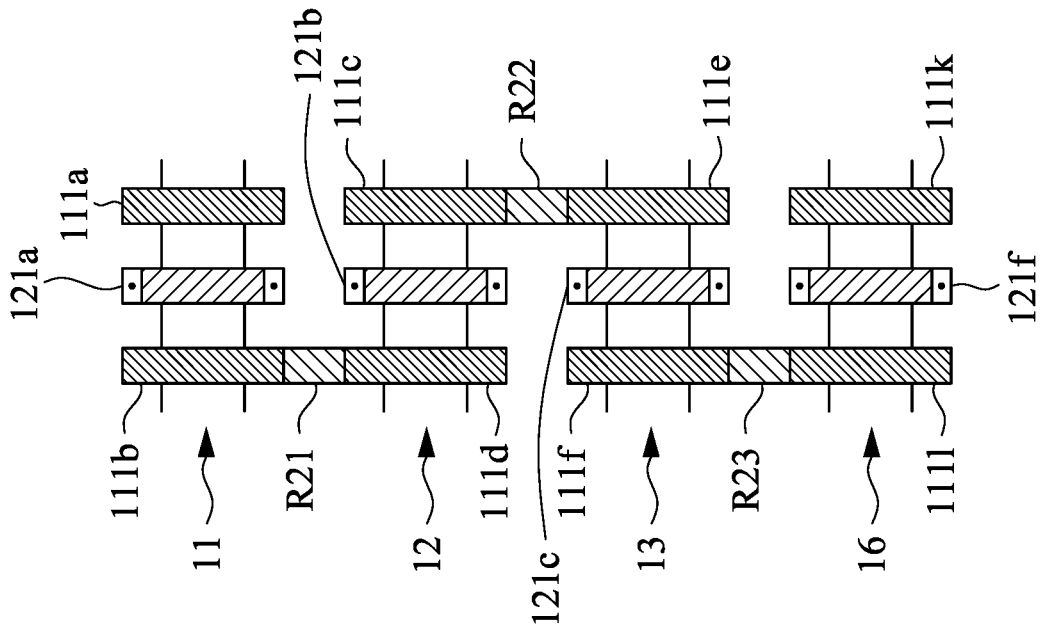

FIG. 4B is a schematic top view showing the first resistor circuit 451 and an equivalent circuit thereof in accordance with some embodiments of the present disclosure. The first resistor circuit 451 is similar the first resistor circuit 151 shown in FIG. 1B. However, the first resistor circuit 451 does not include the fourth row 14 and the fifth row 15 shown in FIG. 1B. In this case, the resistor R23 is electrically connected between the source/drain 111*f* and the source/drain 111*l*. When the first resistor circuit 451 is operated, the gate structures 121*a* and 121*f* in the first row 11 and the sixth row 16 are always short-circuited to reduce the values of the parasitic resistances $R_{parasitic-61}$ and $R_{parasitic-62}$, and the gate structures 121*b* and 121*c* are turned on/off in accordance with the predetermined resistance value. Therefore, switches SW61 and SW62 are used to represent the gate structures 121*b* and 121*c*, and resistance ER6 is used to represent a sum of the values of the resistors R21, R22 and R23.

Figure 4C:
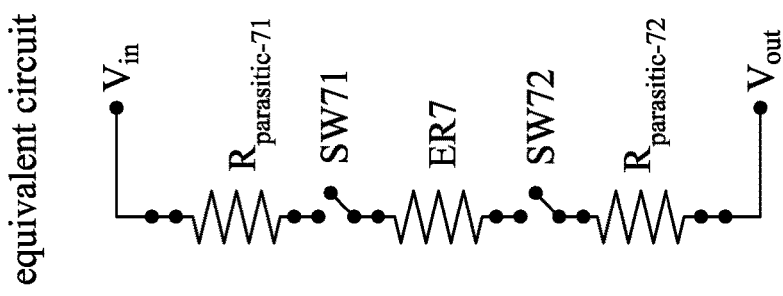
FIG. 4C is a schematic top view showing the second resistor circuit and an equivalent circuit thereof in accordance with some embodiments of the present disclosure.
Figure 4C:
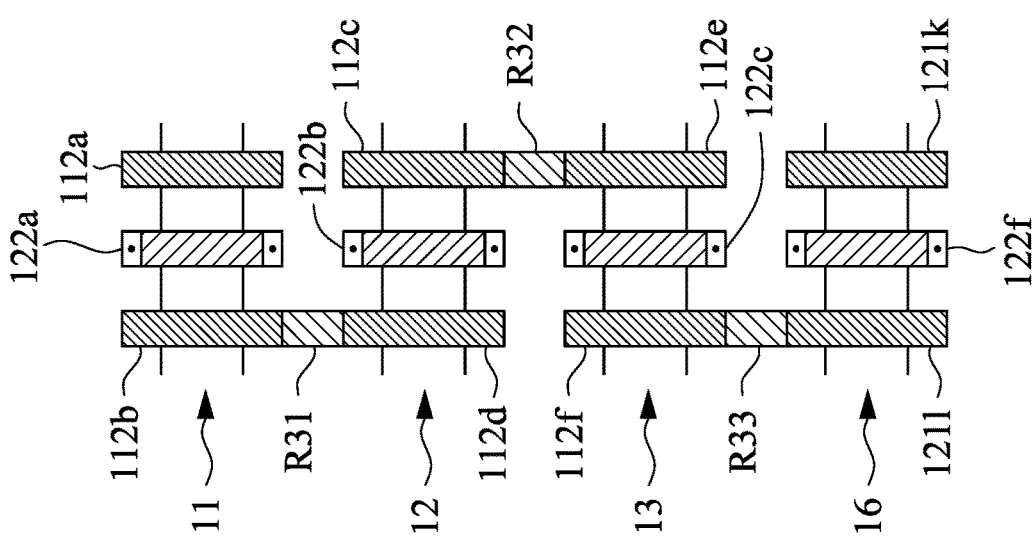

FIG. 4C is a schematic top view showing the second resistor circuit 452 and an equivalent circuit thereof in accordance with some embodiments of the present disclosure. The second resistor circuit 452 is similar the second resistor circuit 152 shown in FIG. 1C. However, the second resistor circuit 452 does not include the fourth row 14 and the fifth row 15 shown in FIG. 1C. In this case, the resistor R33 is electrically connected between the source/drain 112*f* and the source/drain 112*l*. When the second resistor circuit 452 is operated, the gate structures 122*a* and 122*f* in the first row 11 and the sixth row 16 are always short-circuited to reduce the values of the parasitic resistances $R_{parasitic-71}$ and $R_{parasitic-72}$, and the gate structures 122*b* and 122*c* are turned on/off in accordance with the predetermined resistance value. Therefore, switches SW71 and SW72 are used to represent the gate structures 122*b* and 122*c*, and resistance ER7 is used to represent a sum of the values of the resistors R31, R32 and R23.

Figure 4D:
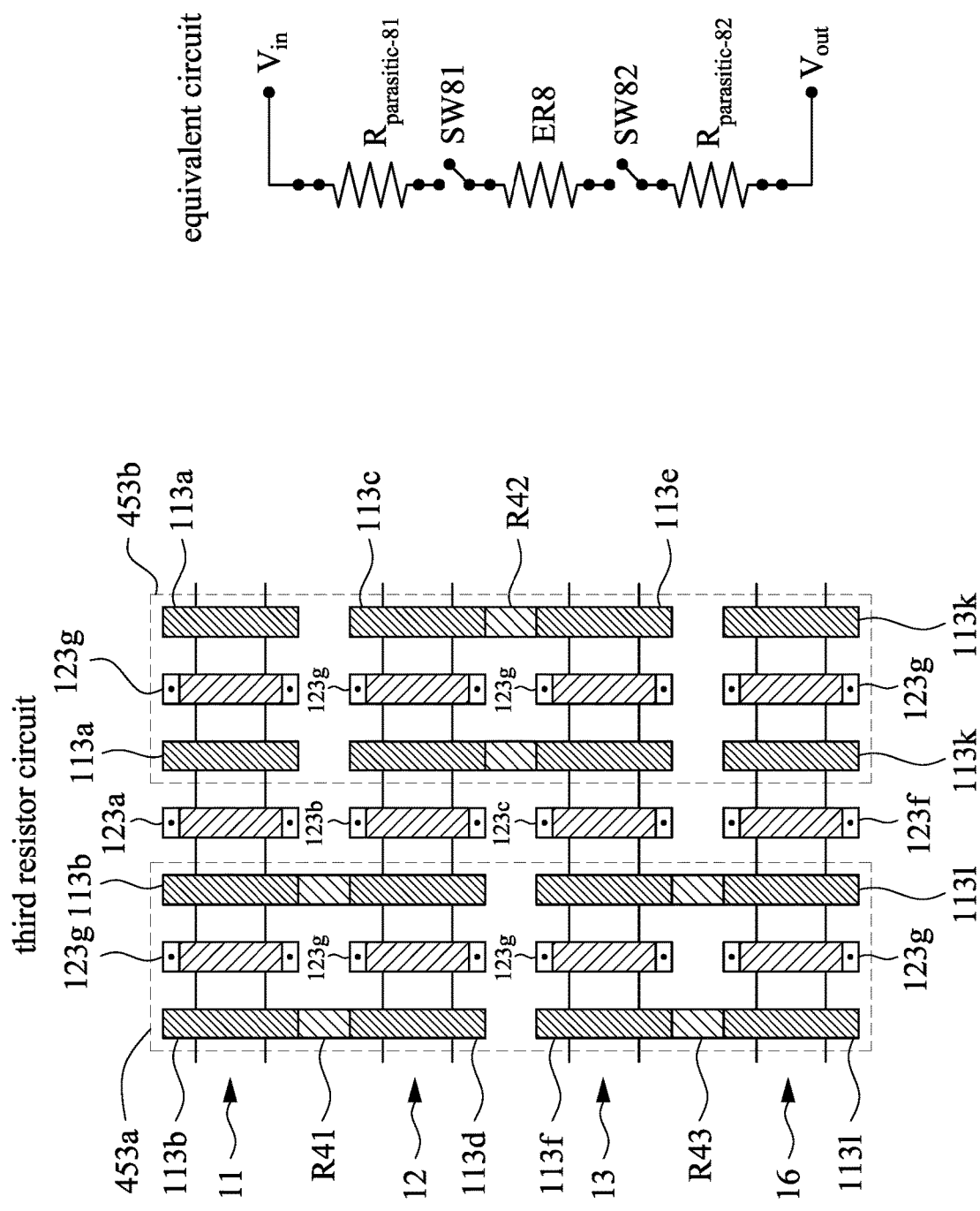
FIG. 4D is a schematic top view showing the third resistor circuit and an equivalent circuit thereof in accordance with some embodiments of the present disclosure.

FIG. 4D is a schematic top view showing the third resistor circuit 453 and an equivalent circuit thereof in accordance with some embodiments of the present disclosure. The third resistor circuit 453 is similar the third resistor circuit 153 shown in FIG. 1D. However, the third resistor circuit 453 does not include the fourth row 14 and the fifth row 15 shown in FIG. 1D. In this case, the resistors R43 are electrically connected between the sources/drains 113*f* and the sources/drains 113*l*. The third resistor circuit 453 can be divided into a left part 453*a* and a right part 453*b*. When the third resistor circuit 453 is operated, the gate structures 123*g* in the left part 453*a* and the right part 453*b* are always short-circuited to reduce the values of the parasitic resistances $R_{parasitic-81}$ and $R_{parasitic-82}$, and the gate structures 123*b* and 123*c*, disposed between the left part 453*a* and the right part 453*b* are turned on/off in accordance with the predetermined resistance value. Therefore, switches SW81 and SW82 are used to represent the gate structures 123*b* and 123*c*, and resistance ER8 is used to represent a sum of the values of the resistors R41, R42 and R43.

Figure 4E:
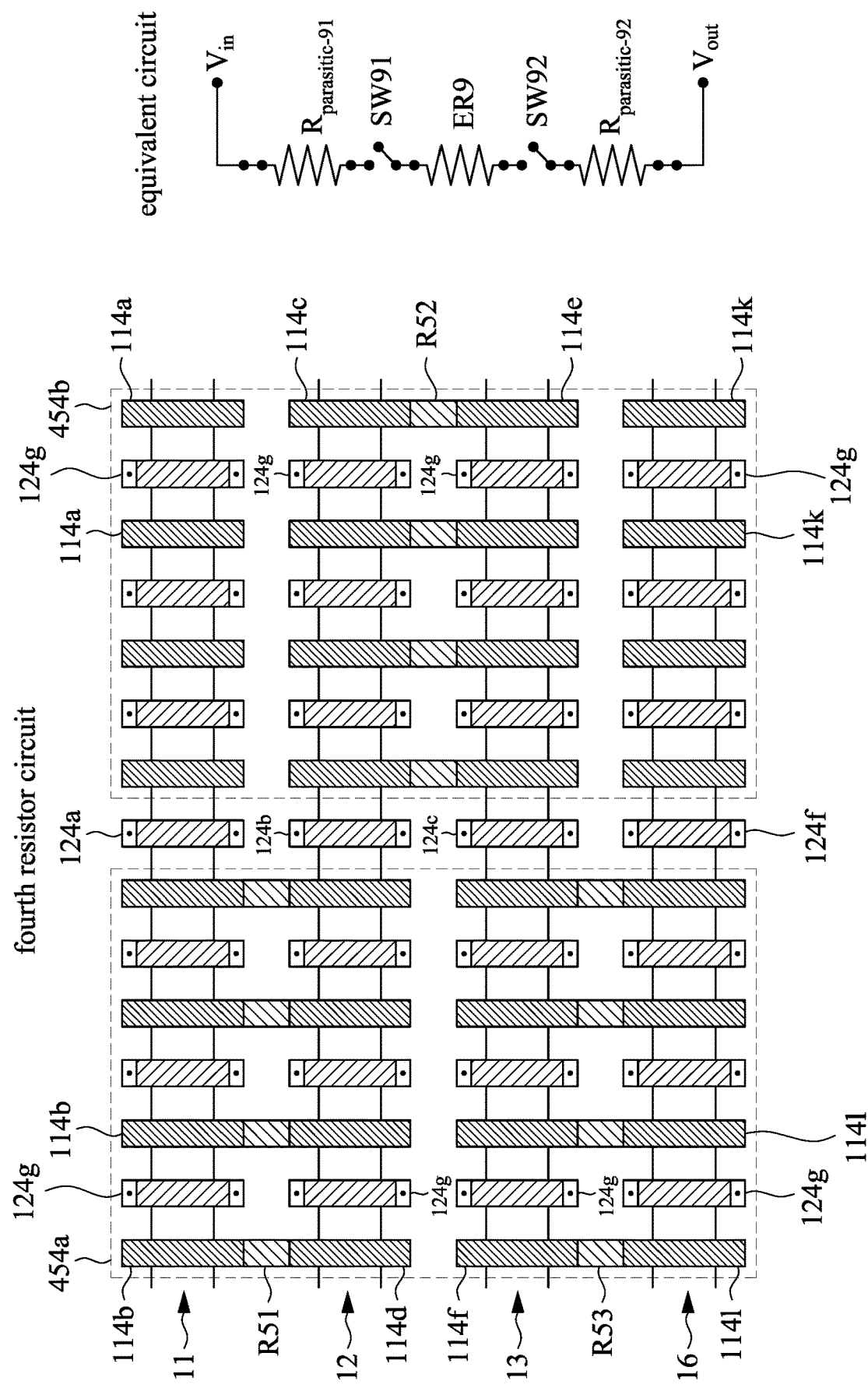
FIG. 4E is a schematic top view showing the fourth resistor circuit and an equivalent circuit thereof in accordance with some embodiments of the present disclosure.

FIG. 4E is a schematic top view showing the fourth resistor circuit 454 and an equivalent circuit thereof in accordance with some embodiments of the present disclosure. The fourth resistor circuit 454 is similar the fourth resistor circuit 154 shown in FIG. 1E. However, the fourth resistor circuit 454 does not include the fourth row 14 and the fifth row 15 shown in FIG. 1E. In this case, the resistors R53 are electrically connected between the sources/drains 114*f* and the sources/drains 114*l*. The fourth resistor circuit 454 can be divided into a left part 454*a* and a right part 454*b*. When the fourth resistor circuit 454 is operated, the gate structures 124*g* in the left part 454*a* and the right part 454*b* are always short-circuited to reduce the values of the parasitic resistances $R_{parasitic-91}$ and $R_{parasitic-92}$, and the gate structures 124*b* and 124*c*, disposed between the left part 454*a* and the right part 454*b* are turned on/off in accordance with the predetermined resistance value. Therefore, switches SW91 and SW92 are used to represent the gate structures 124*b* and 124*c*, and resistance ER9 is used to represent a sum of the values of the resistors R51, R52 and R53.

Figure 4F:
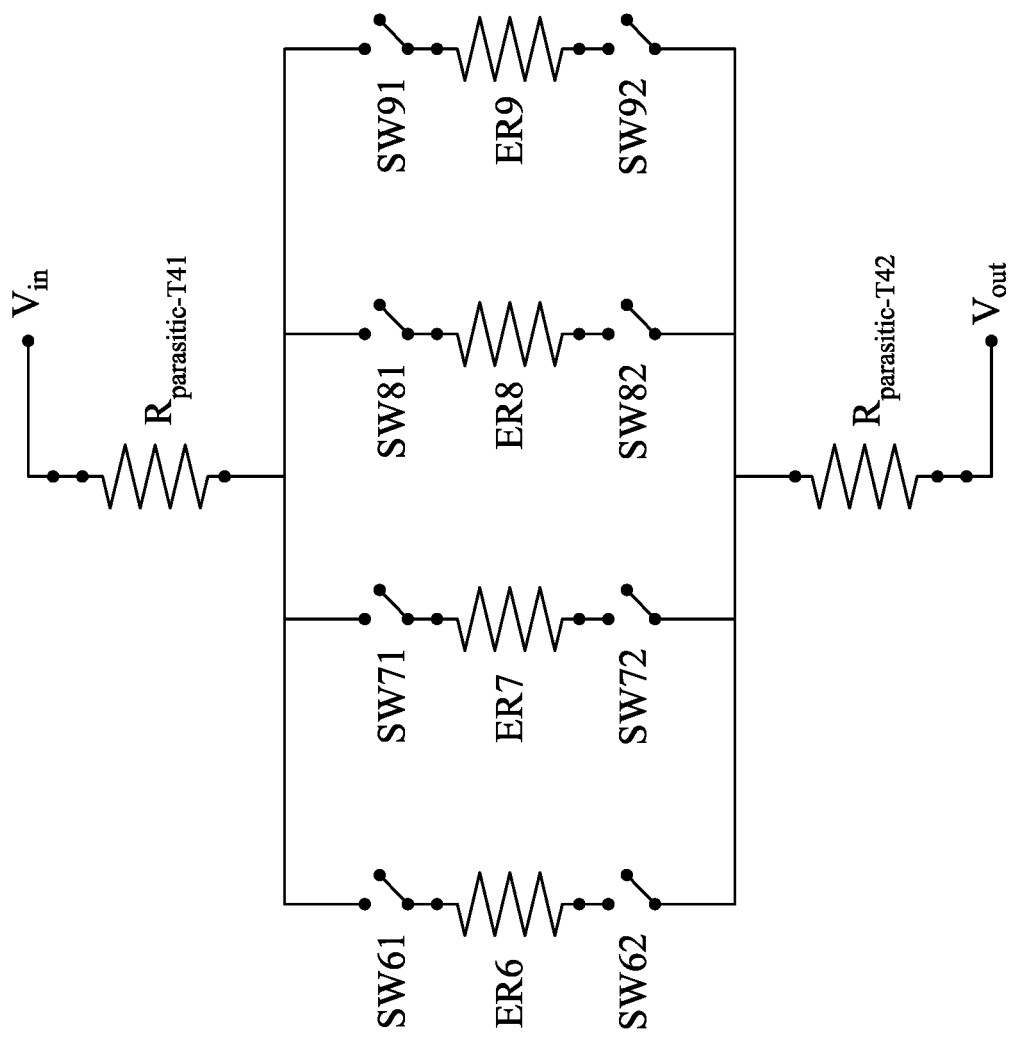
FIG. 4F is a schematic circuit diagram showing an equivalent circuit of the trimmable resistor circuit in accordance with some embodiments of the present disclosure.

FIG. 4F is a schematic circuit diagram showing an equivalent circuit of the trimmable resistor circuit 400 in accordance with some embodiments of the present disclosure. Because the first resistor circuit 451, the second resistor circuit 452, the third resistor circuit 453 and the fourth resistor circuit 454 are electrically connected in parallel, the parasitic resistances $R_{parasitic-61}$, $R_{parasitic-71}$, $R_{parasitic-81}$ and $R_{parasitic-91}$ are electrically connected in parallel and represented by a parasitic resistance $R_{parasitic-T41}$, and the parasitic resistances $R_{parasitic-92}$, $R_{parasitic-72}$, $R_{parasitic-82}$ and $R_{parasitic-92}$ are electrically connected in parallel and represented by a parasitic resistance $R_{parasitic-T42}$. As shown in FIG. 4F, a resistance value of the trimmable resistor circuit 400 is determined by the states of the switches SW61, SW62, SW71, SW72, SW81, SW82, SW91 and SW92. Therefore, the user can switch the switches SW61, SW62, SW71, SW72, SW81, SW82, SW91 and SW92 to enable the trimmable resistor circuit 400 to have the predetermined resistance value desired for the user.

In the above embodiments, the trimmable resistor circuit includes plural rows of FinFET devices which can be divided into a first resistor circuit, a second resistor circuit, a third resistor circuit and a fourth resistor circuit. The gate structures in the first row and the last row are short-circuited to enable the first resistor circuit, the second resistor circuit, the third resistor circuit and the fourth resistor circuit to be electrically connected in parallel. At least one gate structure in each of the second row, the third row, the fourth row and the fifth row of the first resistor circuit, the second resistor circuit, the third resistor circuit and the fourth circuit are turned on/off in accordance with a predetermined resistance value desired for a user, thereby enabling the trimmable resistor circuit to have the predetermined resistance value. Therefore, the trimmable resistor circuit has better layout area utilization.

In accordance with an embodiment of the present disclosure, the present disclosure discloses a trimmable resistor circuit. The trimmable resistor circuit includes first sources/drains and first gate structures alternatively arranged in a first row, second sources/drains and second gate structures alternatively arranged in a second row, third sources/drains and third gate structures alternatively arranged in a third row, first resistors disposed between the first row and the second row, and second resistors disposed between the second row and the third row. At least one of the first sources/drains is electrically connected to at least one of the second sources/drains. At least one of the second sources/drains is electrically connected to at least one of the third sources/drains.

In some embodiments, the first gate structures in the first row are turned on, such that the first sources/drains in the first row are short-circuited.

In some embodiments, the third gate structures in the third row are turned on, such that the third sources/drains in the third row are short-circuited.

In some embodiments, at least one of the second gate structures is switched in accordance with a predetermined resistance value.

In some embodiments, the trimmable resistor circuit further includes plural fin structures, in which the first sources/drains, the first gate structures, the second sources/drains, the second gate structures, the third sources/drains and the third gate structures are disposed on the fin structures.

In accordance with an embodiment of the present disclosure, the present disclosure discloses a trimmable resistor circuit. The trimmable resistor circuit includes a first resistor circuit including first sources/drains, a first gate structure disposed between the first sources/drains, second sources/drains, a second gate structure disposed between the second sources/drains, third sources/drains, a third gate structure disposed between the third sources/drains, fourth sources/drains, a fourth gate structure disposed between the fourth sources/drains, a first resistor, a second resistor and a third resistor. The first resistor is electrically connected between a first one of the first sources/drains and a first one of the second sources/drains. The second resistor is electrically connected between a second one of the second sources/drains and a first one of the third sources/drains. The third resistor electrically connected between a second one of the third sources/drains and a first one of the fourth sources/drains.

In some embodiments, the trimmable resistor circuit further includes a second resistor circuit. The second resistor circuit includes fifth sources/drains, a fifth gate structure, sixth sources/drains, a sixth gate structure, seventh sources/drains and a seventh gate, eighth sources/drains, an eighth gate structure, a first resistor group, a second resistor group and a third resistor group. The fifth gate structure is disposed between the fifth sources/drains to divide the fifth sources/drains into a first group of sources/drains and a second group of sources/drains. The sixth gate structure is disposed between the sixth sources/drains to divide the sixth sources/drains into a third group of sources/drains and a fourth group of sources/drains. The seventh gate structure is disposed between the seventh sources/drains to divide the seventh sources/drains into a fifth group of sources/drains and a sixth group of sources/drains. The eighth gate structure is disposed between the eighth sources/drains to divide the eighth sources/drains into a seventh group of sources/drains and a eighth group of sources/drains. The first resistor group is electrically connected between the first group of sources/drains and the third group of sources/drains. The second resistor group is electrically connected between the fourth group of sources/drains and the sixth group of sources/drains. The third resistor group is electrically connected between the fifth group of sources/drains and the seventh group of sources/drains.

In some embodiments, the trimmable resistor circuit further includes a ninth gate structure and a tenth gate structure disposed between the first resistor circuit and the second resistor circuit, in which the ninth gate structure and the tenth gate structure are open.

In some embodiments, the first gate structure, fourth gate structure, the fifth gate structure and the eighth gate structure are short-circuited.

In some embodiments, the trimmable resistor circuit further includes an eleventh gate structure and a twelfth gate structure. The eleventh gate structure and the twelfth gate structure are disposed between the first resistor circuit and the second resistor circuit, in which the eleventh gate structure and the twelfth gate structure are short-circuited, such that the first sources/drains are electrically connected to the fifth sources/drains, and the fourth sources/drains are electrically connected to the eighth sources/drains.

In some embodiments, the trimmable resistor circuit further includes at least one thirteenth gate structure and at least one fourteenth gate structure. The at least one thirteenth gate structure are disposed between the sixth sources/drains of the third group of sources/drains. The at least one fourteenth gate structure is disposed between the sixth sources/drains of the fourth group of sources/drains. The thirteenth gate structure and the fourteenth gate structure are short-circuited, such that the sixth sources/drains of the third group of sources/drains are short-circuited, and the sixth sources/drains of the fourth group of sources/drains are short-circuited.

In some embodiments, the trimmable resistor circuit further includes at least one fifteenth gate structure and at least one sixteenth gate structure. The fifteenth gate structure and the sixteenth gate structure are short-circuited, such that the seventh sources/drains of the fifth group of sources/drains are short-circuited, and the seventh sources/drains of the sixth group of sources/drains are short-circuited.

In some embodiments, the first gate structure, the fourth gate structure, the fifth gate structure and the eighth gate structure are short-circuited, such that the first resistor circuit and the second resistor circuit are electrically connected in parallel.

In some embodiments, the first sources/drains, the first gate structure, the fifth sources/drains and the fifth gate structure are arranged in a row.

In some embodiments, the second sources/drains, the second gate structure, the sixth sources/drains and the sixth gate structure are arranged in a row.

In some embodiments, the third sources/drains, the third gate structure, the seventh sources/drains and the seventh gate structure are arranged in a row.

In some embodiments, the fourth sources/drains, the fourth gate structure, the eighth sources/drains and the eighth gate structure are arranged in a row.

In some embodiments, the trimmable resistor circuit further includes plural fin structures. The first sources/drains, the first gate structure, the second sources/drains, the second gate structure, the third sources/drains, the third gate structure, the fourth sources/drains and the fourth gate structure are disposed on the fin structures.

In accordance with an embodiment of the present disclosure, the present disclosure discloses a method for operating a trimmable resistor circuit. In the method, at first, a first voltage is applied on plural first gate structures in a first row of FinFET devices to turn on the first gate structures, such that a plurality of first sources/drains in the first row of FinFET devices are short-circuited. Then, a second voltage is applied on plural second gate structures in a second row of FinFET devices to turn on the second gate structures, such that plural second sources/drains in the second row of FinFET devices are short-circuited. Thereafter, a third voltage is applied on plural third gate structures in a third row of FinFET devices in accordance with a predetermined resistance value.

In some embodiments, the method for operating a trimmable resistor circuit further comprising applying a fourth voltage on a plurality of fourth gate structures in the third row of FinFET devices and in the fourth row of FinFET devices to turn off the fourth gate structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A trimmable resistor circuit, comprising:
   a first resistor circuit comprising:
      a plurality of first sources/drains and a first gate structure disposed between the first sources/drains;
      a plurality of second sources/drains and a second gate structure disposed between the second sources/drains;
      a plurality of third sources/drains and a third gate structure disposed between the third sources/drains;
      a plurality of fourth sources/drains and a fourth gate structure disposed between the fourth sources/drains;
      a first resistor electrically connected between a first one of the first sources/drains and a first one of the second sources/drains;
      a second resistor electrically connected between a second one of the second sources/drains and a first one of the third sources/drains; and
      a third resistor electrically connected between a second one of the third sources/drains and a first one of the fourth sources/drains; and
   a second resistor circuit comprising:
      a plurality of fifth sources/drains and a fifth gate structure disposed between the fifth sources/drains to divide the fifth sources/drains into a first group of sources/drains and a second group of sources/drains;
      a plurality of sixth sources/drains and a sixth gate structure disposed between the sixth sources/drains to divide the sixth sources/drains into a third group of sources/drains and a fourth group of sources/drains;
      a plurality of seventh sources/drains and a seventh gate structure disposed between the seventh sources/drains to divide the seventh sources/drains into a fifth group of sources/drains and a sixth group of sources/drains;
      a plurality of eighth sources/drains and an eighth gate structure disposed between the eighth sources/drains to divide the eighth sources/drains into a seventh group of sources/drains and a eighth group of sources/drains;
      a first resistor group electrically connected between the first group of sources/drains and the third group of sources/drains;
      a second resistor group electrically connected between the fourth group of sources/drains and the sixth group of sources/drains; and
      a third resistor group electrically connected between the fifth group of sources/drains and the seventh group of sources/drains.

2. The trimmable resistor circuit of claim 1, further comprising a ninth gate structure and a tenth gate structure disposed between the first resistor circuit and the second resistor circuit, wherein the ninth gate structure and the tenth gate structure are open.

3. The trimmable resistor circuit of claim 1, wherein the first gate structure, the fourth gate structure, the fifth gate structure and the eighth gate structure are short-circuited.

4. The trimmable resistor circuit of claim 2, further comprising an eleventh gate structure and a twelfth gate structure disposed between the first resistor circuit and the second resistor circuit, wherein the eleventh gate structure and the twelfth gate structure are short-circuited, such that the first sources/drains are electrically connected to the fifth sources/drains, and the fourth sources/drains are electrically connected to the eighth sources/drains.

5. The trimmable resistor circuit of claim 1, wherein the second resistor circuit further comprises:
   at least one thirteenth gate structure disposed between the sixth sources/drains of the third group of sources/drains; and
   at least one fourteenth gate structure disposed between the sixth sources/drains of the fourth group of sources/drains;
   wherein the thirteenth gate structure and the fourteenth gate structure are short-circuited, such that the sixth sources/drains of the third group of sources/drains are short-circuited, and the sixth sources/drains of the fourth group of sources/drains are short-circuited.

6. The trimmable resistor circuit of claim 1, wherein the second resistor circuit further comprises:
   at least one fifteenth gate structure disposed between the seventh sources/drains of the fifth group of sources/drains; and
   at least one sixteenth gate structure disposed between the seventh sources/drains of the sixth group of sources/drains;
   wherein the fifteenth gate structure and the sixteenth gate structure are short-circuited, such that the seventh sources/drains of the fifth group of sources/drains are short-circuited, and the seventh sources/drains of the sixth group of sources/drains are short-circuited.

7. The trimmable resistor circuit of claim 1, wherein the first gate structure, the fourth gate structure, the fifth gate structure and the eighth gate structure are short circuited, such that the first resistor circuit and the second resistor circuit are electrically connected in parallel.

8. The trimmable resistor circuit of claim 1, wherein the first sources/drains, the first gate structure, the fifth sources/drains and the fifth gate structure are arranged in a row.

9. The trimmable resistor circuit of claim 1, wherein the second sources/drains, the second gate structure, the sixth sources/drains and the sixth gate structure are arranged in a row.

10. The trimmable resistor circuit of claim 1, wherein the third sources/drains, the third gate structure, the seventh sources/drains and the seventh gate structure are arranged in a row.

11. The trimmable resistor circuit of claim 1, wherein the fourth sources/drains, the fourth gate structure, the eighth sources/drains and the eighth gate structure are arranged in a row.

12. The trimmable resistor circuit of claim 1, further comprising a plurality of fin structures, wherein the first sources/drains, the first gate structure, the second sources/drains, the second gate structure, the third sources/drains, the third gate structure, the fourth sources/drains and the fourth gate structure are disposed on the fin structures.

13. A trimmable resistor circuit, comprising:
   a first resistor circuit comprising:
      a plurality of first sources/drains and a first gate structure disposed between the first sources/drains;

a plurality of second sources/drains and a second gate structure disposed between the second sources/drains;
a plurality of third sources/drains and a third gate structure disposed between the third sources/drains;
a plurality of fourth sources/drains and a fourth gate structure disposed between the fourth sources/drains;
a first resistor electrically connected between a first one of the first sources/drains and a first one of the second sources/drains;
a second resistor electrically connected between a second one of the second sources/drains and a first one of the third sources/drains; and
a third resistor electrically connected between a second one of the third sources/drains and a first one of the fourth sources/drains; and
a second resistor circuit comprising:
a plurality of fifth sources/drains and a fifth gate structure disposed between the fifth sources/drains to divide the fifth sources/drains into a first group of sources/drains and a second group of sources/drains;
a plurality of sixth sources/drains and a sixth gate structure disposed between the sixth sources/drains to divide the sixth sources/drains into a third group of sources/drains and a fourth group of sources/drains;
a first resistor group electrically connected between the first group of sources/drains and the third group of sources/drains;
a plurality of seventh sources/drains and a seventh gate structure disposed between the seventh sources/drains to divide the seventh sources/drains into a fifth group of sources/drains and a sixth group of sources/drains;
a second resistor group electrically connected between the fourth group of sources/drains and the sixth group of sources/drains;
a plurality of eighth sources/drains and an eighth gate structure disposed between the eighth sources/drains to divide the eighth sources/drains into a seventh group of sources/drains and a eighth group of sources/drains; and
a third resistor group electrically connected between the fifth group of sources/drains and the seventh group of sources/drains.

14. The trimmable resistor circuit of claim 13, wherein the first group of sources/drains is arranged in a first row, the second group of sources/drains is arranged in a second row, and the first resistor group is disposed between the first row and the second row.

15. The trimmable resistor circuit of claim 14, wherein the fourth group of sources/drains is arranged in the second row, the sixth group of sources/drains is arranged in a third row, and the second resistor group is disposed between the second row and the third row.

16. A trimmable resistor circuit, comprising:
a first resistor circuit comprising:
a plurality of first sources/drains and a first gate structure disposed between the first sources/drains;
a plurality of second sources/drains and a second gate structure disposed between the second sources/drains;
a plurality of third sources/drains and a third gate structure disposed between the third sources/drains;
a plurality of fourth sources/drains and a fourth gate structure disposed between the fourth sources/drains;
a first resistor electrically connected between a first one of the first sources/drains and a first one of the second sources/drains;
a second resistor electrically connected between a second one of the second sources/drains and a first one of the third sources/drains;
a third resistor electrically connected between a second one of the third sources/drains and a first one of the fourth sources/drains;
a second resistor circuit comprising:
a plurality of fifth sources/drains and a fifth gate structure disposed between the fifth sources/drains to divide the fifth sources/drains into a first group of sources/drains and a second group of sources/drains;
a plurality of sixth sources/drains and a sixth gate structure disposed between the sixth sources/drains to divide the sixth sources/drains into a third group of sources/drains and a fourth group of sources/drains;
a plurality of seventh sources/drains and a seventh gate structure disposed between the seventh sources/drains to divide the seventh sources/drains into a fifth group of sources/drains and a sixth group of sources/drains;
a plurality of eighth sources/drains and an eighth gate structure disposed between the eighth sources/drains to divide the eighth sources/drains into a seventh group of sources/drains and a eighth group of sources/drains;
a first resistor group electrically connected between the first group of sources/drains and the third group of sources/drains;
a second resistor group electrically connected between the fifth group of sources/drains and the seventh group of sources/drains and;
a third resistor group electrically connected between the fourth group of sources/drains and the sixth group of sources/drains.

17. The trimmable resistor circuit of claim 16, wherein the fifth gate structure is arranged in a first row, the sixth gate structure is arranged in a second row, and the first resistor group is disposed between the first row and the second row.

18. The trimmable resistor circuit of claim 16, wherein the seventh gate structure is arranged in a third row, the eighth gate structure is arranged in a fourth row, and the second resistor group is disposed between the third row and the fourth row.

* * * * *